(12) United States Patent
Hayashiguchi et al.

(10) Patent No.: US 11,664,298 B2
(45) Date of Patent: May 30, 2023

(54) SEMICONDUCTOR MODULE

(71) Applicant: ROHM CO., LTD., Kyoto (JP)

(72) Inventors: Masashi Hayashiguchi, Kyoto (JP); Takumi Kanda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/721,869

(22) Filed: Apr. 15, 2022

(65) Prior Publication Data

US 2022/0246507 A1 Aug. 4, 2022

Related U.S. Application Data

(63) Continuation of application No. 17/044,443, filed as application No. PCT/JP2019/019110 on May 14, 2019, now Pat. No. 11,328,985.

(30) Foreign Application Priority Data

Jun. 11, 2018 (JP) ................................ 2018-110934

(51) Int. Cl.
*H01L 23/495* (2006.01)
*H01L 23/31* (2006.01)
*H01L 23/50* (2006.01)

(52) U.S. Cl.
CPC .... *H01L 23/49575* (2013.01); *H01L 23/3107* (2013.01); *H01L 23/4952* (2013.01);
(Continued)

(58) Field of Classification Search
CPC ........... H01L 23/49575; H01L 23/3107; H01L 23/49506; H01L 23/4952; H01L 23/49562; H01L 23/49568; H01L 23/49589

See application file for complete search history.

(56) References Cited

U.S. PATENT DOCUMENTS

2014/0035658 A1* 2/2014 Usui ....................... H01L 24/34
327/512
2017/0287828 A1* 10/2017 Sawada .................. H01L 25/18
2018/0084661 A1 3/2018 Schuetz et al.

FOREIGN PATENT DOCUMENTS

JP 2013-153010 A 8/2013
JP 2014-53516 A 3/2014
(Continued)

OTHER PUBLICATIONS

International Search Report issued in PCT/JP2019/019110, dated Aug. 6, 2019 (2 pages).

(Continued)

*Primary Examiner* — Marc Anthony Armand
(74) *Attorney, Agent, or Firm* — Hamre, Schumann, Mueller & Larson, P.C.

(57) ABSTRACT

A semiconductor module includes a semiconductor device and bus bar. The device includes an insulating substrate, conductive member, switching elements, and first/second input terminals. The substrate has main/back surfaces opposite in a thickness direction, with the conductive member disposed on the main surface. The switching elements are connected to the conductive member. The first input terminal, including a first terminal portion, is connected to the conductive member. The second input terminal, including a second terminal portion overlapping with the first terminal portion in the thickness direction, is connected to the switching elements. The second input terminal is separate from the first input terminal and conductive member in the thickness direction. The bus bar includes first/second terminals. The second terminal, separate from the first terminal in the thickness direction, partially overlaps with the first terminal in the thickness direction. The first/second terminals are connected to the first/second terminal portions, respectively.

17 Claims, 28 Drawing Sheets

(52) U.S. Cl.
CPC .. *H01L 23/49506* (2013.01); *H01L 23/49562* (2013.01); *H01L 23/49568* (2013.01); *H01L 23/49589* (2013.01); *H01L 23/50* (2013.01)

(56) References Cited

FOREIGN PATENT DOCUMENTS

| JP | 2015-130751 A | 7/2015 |
| WO | 2015/162712 A1 | 10/2015 |
| WO | 2017/209191 A1 | 12/2017 |

OTHER PUBLICATIONS

Office Action received in the corresponding Japanese Patent application, dated Aug. 2, 2022, and machine translation (8 pages).

\* cited by examiner

SEMICONDUCTOR MODULE

TECHNICAL FIELD

The present disclosure relates to a semiconductor module that includes, as constituent elements, a semiconductor device that includes a plurality of switching elements, and a bus bar that is joined to the semiconductor device in a state of being electrically connected thereto and in which laminated wiring is realized.

BACKGROUND ART

Conventionally, semiconductor devices on which a plurality of switching elements such as MOSFETs are mounted are widely known. Such a semiconductor device functions to convert direct current power into alternating current power using the plurality of switching elements. The semiconductor device includes one pair of input terminals to which direct current power is input.

Patent Document 1 discloses one example of a semiconductor module that includes the semiconductor device and a rod-shaped conductor assembly that is connected to the pair of input terminals of the semiconductor device. As a result of the rod-shaped conductor assembly being connected to a direct current power source, direct current power is supplied via the rod-shaped conductor assembly to the semiconductor device. In the rod-shaped conductor assembly, two pairs of conductor rods are arranged in a short side direction of the semiconductor device, each pair being constituted by a rod-shaped conductor, which serves as a positive electrode, and a rod-shaped conductor, which serves as a negative electrode, that are arranged close to each other with an insulating sheet member interposed therebetween. Thus, laminated wiring is realized in the rod-shaped conductor assembly.

When the semiconductor device is in operation, inductance is generated in the semiconductor device as a result of the plurality of switching elements being switched from on to off. However, laminated wiring is realized in the rod-shaped conductor assembly, and therefore inductance is reduced by magnetic fields that are generated at one pair of conductor rods. If inductance is reduced, a surge voltage that is caused by di/dt at the time of switching is reduced and the occurrence of noise is suppressed, and consequently power loss in the semiconductor device is suppressed.

However, the pair of input terminals are spaced apart from each other in the short side direction of the semiconductor device. Therefore, laminated wiring ceases at the pair of input terminals. As a result, there is a concern that inductance reduced by the rod-shaped conductor assembly may increase again at the pair of input terminals.

PRIOR ART DOCUMENTS

Patent Document

Patent Document 1: JP 2015-130751A

SUMMARY OF THE INVENTION

Problems to be Solved by the Invention

In view of the above circumstances, the present disclosure aims to provide a semiconductor module that is capable of more stably reducing inductance of a semiconductor device.

Means for Solving the Problem

A semiconductor module provided by the present disclosure includes: a semiconductor device that includes an insulating substrate with a main surface and a back surface facing opposite to each other in a thickness direction, a conductive member arranged on the main surface, a plurality of switching elements electrically connected to the conductive member, a first input terminal that has a first terminal portion and is electrically connected to the conductive member, and a second input terminal that has a second terminal portion overlapping with the first terminal portion as viewed in the thickness direction, is spaced apart from both the first input terminal and the conductive member in the thickness direction, and is electrically connected to the plurality of switching elements; and a bus bar that includes a first supply terminal and a second supply terminal that is spaced apart from the first supply terminal in the thickness direction and at least partially overlaps with the first supply terminal as viewed in the thickness direction. The first supply terminal is electrically connected to the first terminal portion, and the second supply terminal is electrically connected to the second terminal portion.

Other features and advantages of the present disclosure will be made more clear by the following detailed description based on the accompanying drawings.

MODE FOR CARRYING OUT THE INVENTION

The following describes modes for implementing the present disclosure based on the accompanying drawings.

First Embodiment

Figure 1:
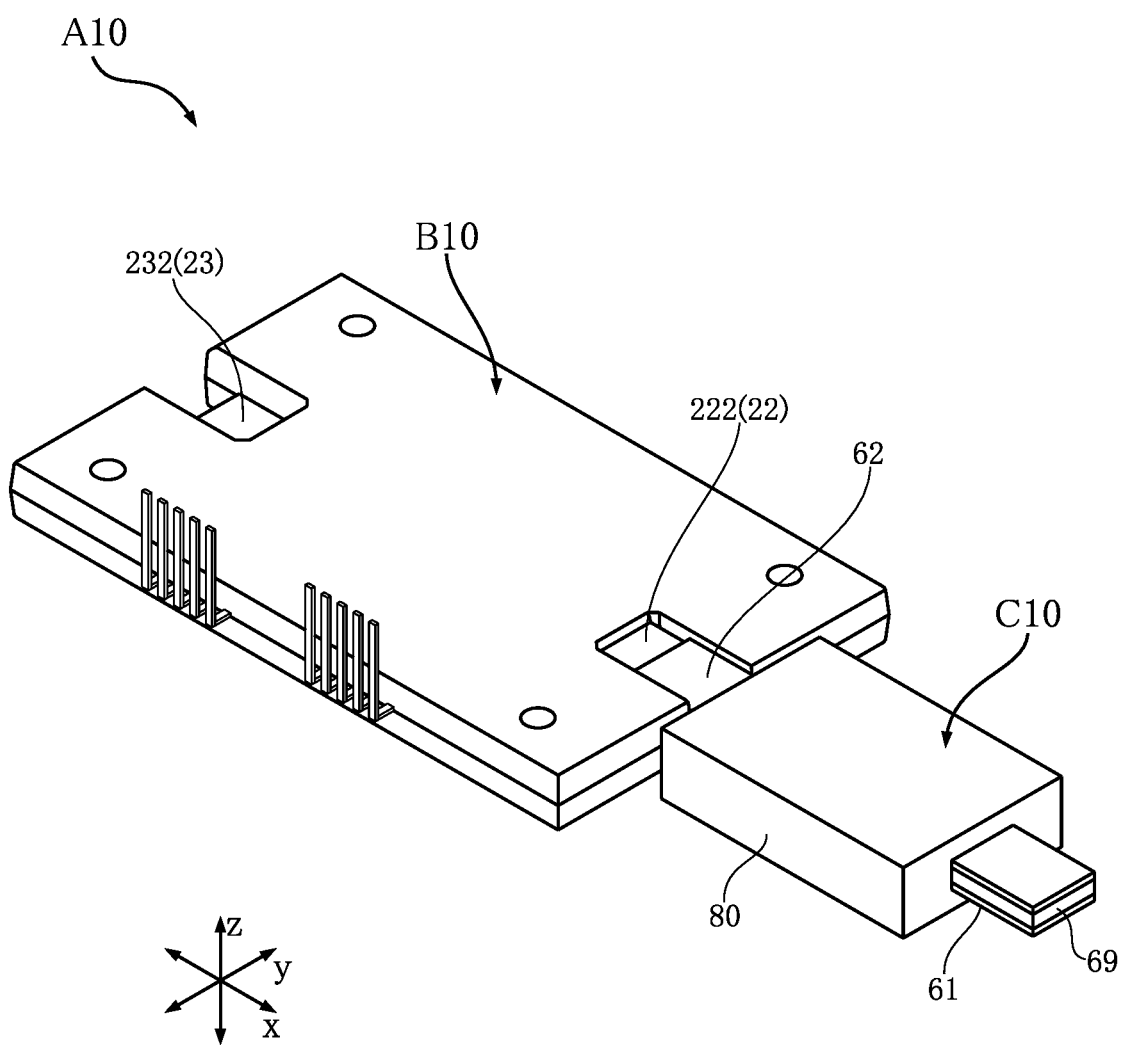
FIG. 1 is a perspective view of a semiconductor module according to a first embodiment of the present disclosure.

A semiconductor module A10 according to a first embodiment of the present disclosure will be described based on FIGS. 1 to 16. As shown in FIG. 1, the semiconductor module A10 includes a semiconductor device B10 and a bus bar C10 as constituent elements. The bus bar C10 is a power supply member that is joined to the semiconductor device B10 in a state of being electrically connected thereto. It should be noted that, in FIG. 3, a sealing resin 50 is transparent, for convenience of understanding. In FIG. 3, lines IX-IX and X-X are each indicated by a dash-dot line. In FIG. 4, the sealing resin 50 and a second input terminal 22 are transparent, for convenience of understanding. In FIG. 13, a line XV-XV is indicated by a dash-dot line.

<Semiconductor Device B10>

The following describes the semiconductor device B10 included in constituent elements of the semiconductor module A10. The semiconductor device B10 shown in FIGS. 2 to 12 is a power conversion device (power module) on which a plurality of switching elements such as MOSFETs are mounted. The semiconductor device B10 is used in a drive source of a motor, an inverter device of various electrical appliances, a DC/DC converter, or the like. The semiconductor device B10 includes an insulating substrate 10, a conductive member 11, a first input terminal 21, a second input terminal 22, an output terminal 23, one pair of gate terminals 24, one pair of detection terminals 25, a plurality of dummy terminals 26, a plurality of switching elements 30, and the sealing resin 50. The plurality of switching elements 30 include a plurality of first elements 30A and a plurality of second elements 30B. In addition to the above, the semiconductor device B10 further includes one pair of insulating layers 12, one pair of gate layers 13, and one pair of detection layers 14.

In describing the semiconductor module A10 including the semiconductor device B10 and the bus bar C10, the thickness direction of the insulating substrate 10 will be referred to as a "thickness direction z", for convenience of description. A direction that is orthogonal to the thickness direction z will be referred to as a "first direction x". A direction that is orthogonal to both the thickness direction z and the first direction x will be referred to as a "second direction y". The semiconductor device B10 has a rectangular shape as viewed in the thickness direction z, i.e., in plan view. The first direction x corresponds to the longitudinal direction of the semiconductor device B10. The second direction y corresponds to the transverse direction of the semiconductor device B10. In describing the semiconductor module A10, the side in the first direction x on which the first input terminal 21 and the second input terminal 22 are located will be referred to as "one side in the first direction x", for convenience of description. The side in the first direction x on which the output terminal 23 is located will be referred to as the "other side in the first direction x". It should be noted that the definitions of the "thickness direction z", "first direction x", "second direction y", "one side in the first direction x", and "other side in the first direction x" also apply to the description of a semiconductor module A20 and a semiconductor module A30, which will be described later.

Figure 9:
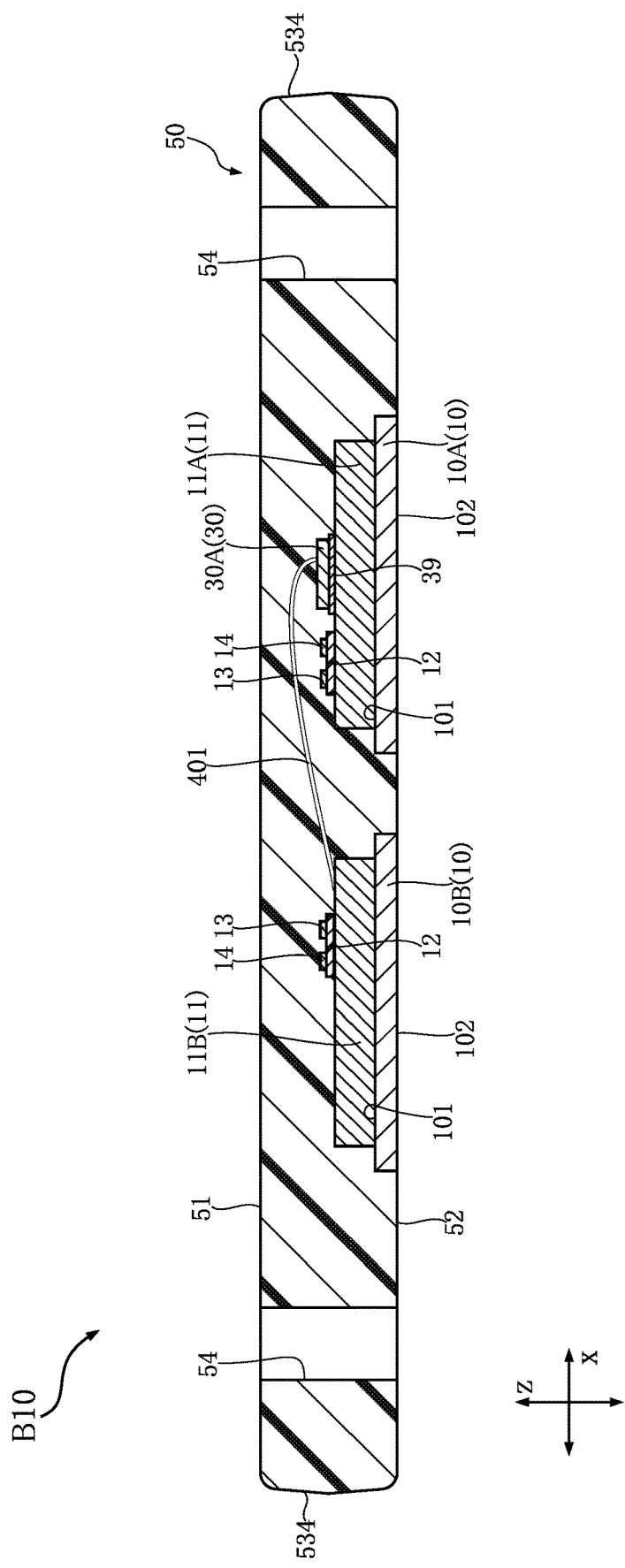
FIG. 9 is a cross-sectional view taken along a line IX-IX in FIG. 3.
Figure 10:
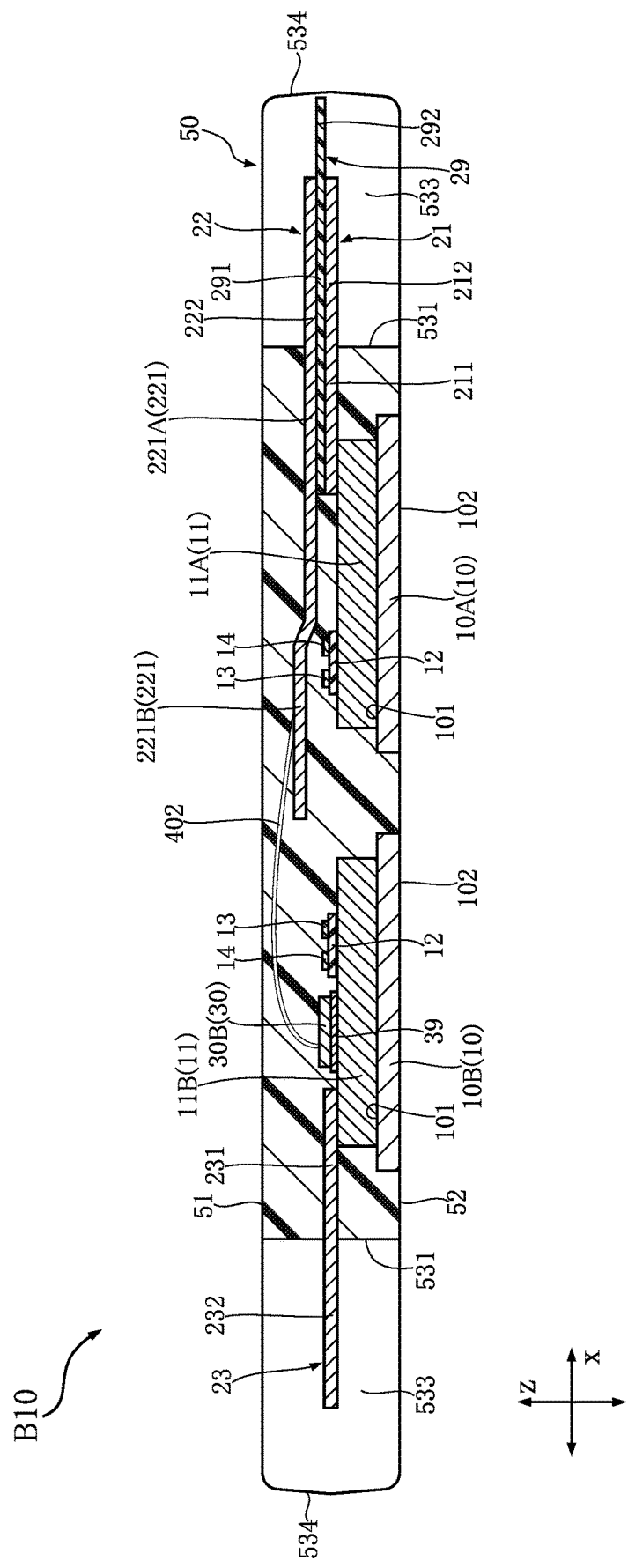
FIG. 10 is a cross-sectional view taken along a line X-X in FIG. 3.

As shown in FIGS. 3, 9, and 10, the conductive member 11 is arranged on the insulating substrate 10. The insulating substrate 10 serves as a support member for the conductive member 11 and the plurality of switching elements 30. The insulating substrate 10 is made of a material that contains a ceramic that has excellent thermal conductivity. Examples of such a ceramic include aluminum nitride (AlN).

Figure 5:
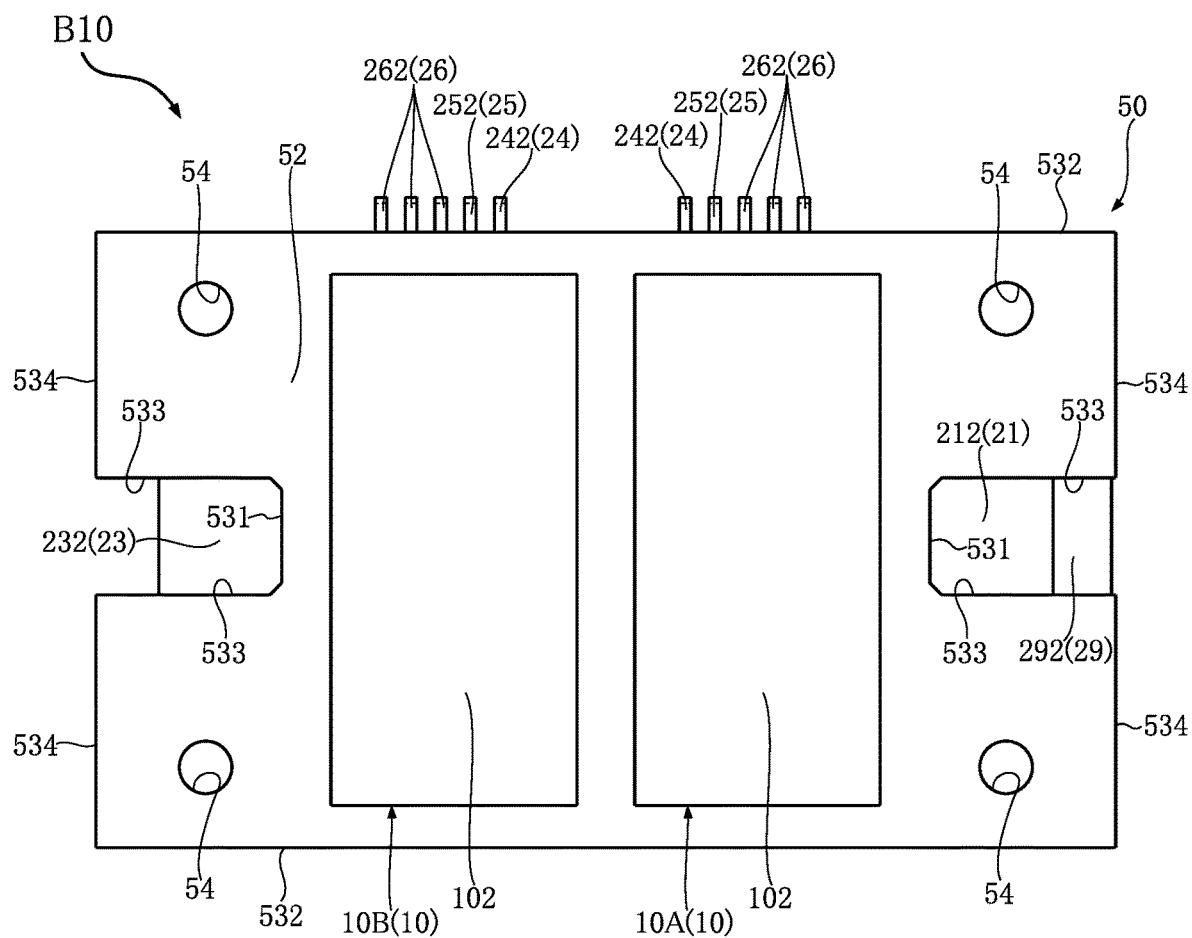
FIG. 5 is a bottom view of the semiconductor device shown in FIG. 2.

As shown in FIGS. 3, 9, and 10, in the semiconductor device B10, which is an example, the insulating substrate 10 includes a first substrate 10A and a second substrate 10B. The first substrate 10A and the second substrate 10B are spaced apart from each other in the first direction x. The first substrate 10A is located on the one side in the first direction x. The second substrate 10B is located on the other side in the first direction x. As viewed in the thickness direction z, the first substrate 10A and the second substrate 10B each have a rectangular shape with long sides thereof extending in the second direction y. The first substrate 10A and the second substrate 10B each have a main surface 101 and a back surface 102 that face opposite sides to each other in the thickness direction z. The main surface 101 faces the side in the thickness direction z on which the conductive member 11 is arranged. The main surface 101 is covered by the sealing resin 50 together with the conductive member 11 and the plurality of switching elements 30. As shown in FIG. 5, the back surface 102 is exposed from the sealing resin 50. It should be noted that the insulating substrate 10 is not limited to this configuration, and may be constituted by a single substrate.

As shown in FIGS. 3, 9, and 10, the conductive member 11 is arranged on the main surface 101 of the insulating substrate 10. The conductive member 11 constitutes a conduction path between the plurality of switching elements 30 and a power supply member such as the bus bar C10, together with the first input terminal 21, the second input terminal 22, and the output terminal 23. The conductive member 11 is a metal plate. The metal plate is made of copper (Cu) or a copper alloy. The conductive member 11 is joined to the main surface 101 using a joining material (not shown) such as a silver (Ag) paste, for example. A surface of the conductive member 11 may be plated with silver, for example.

As shown in FIGS. 3, 9, and 10, in the semiconductor device B10, which is an example, the conductive member 11 includes a first conductive portion 11A and a second conductive portion 11B. As viewed in the thickness direction z, the first conductive portion 11A and the second conductive portion 11B each have a rectangular shape with long sides thereof extending in the second direction y. It should be noted that the configuration of the conductive member 11 is not limited to this configuration and can be set freely based on the number and arrangement of the plurality of switching elements 30 that are set according to the required performance of the semiconductor device B10.

As shown in FIGS. 3 and 9, the first conductive portion 11A is joined to the main surface 101 of the first substrate 10A. The plurality of first elements 30A are joined to a surface of the first conductive portion 11A in a state of being electrically connected to the first conductive portion 11A. As shown in FIGS. 3 and 10, the second conductive portion 11B is joined to the main surface 101 of the second substrate 10B. The plurality of second elements 30B are joined to a surface of the second conductive portion 11B in a state of being electrically connected to the second conductive portion 11B.

As shown in FIGS. 4, 9, and 10, one of the pair of insulating layers 12 is joined to the surface of the first conductive portion 11A, and the other is joined to the surface of the second conductive portion 11B. Each of the pair of insulating layers 12 has the shape of a band extending in the second direction y. The insulating layer 12 that is joined to the surface of the first conductive portion 11A is located on the other side in the first direction x with respect to the plurality of first elements 30A. The insulating layer 12 that is joined to the surface of the second conductive portion 11B is located on the one side in the first direction x with respect to the plurality of second elements 30B. The pair of insulating layers 12 are made of a material that contains a glass epoxy resin, for example.

As shown in FIGS. 4, 9, and 10, one of the pair of gate layers 13 is arranged on the insulating layer 12 joined to the surface of the first conductive portion 11A, and the other is arranged on the insulating layer 12 joined to the surface of the second conductive portion 11B. Each of the pair of gate layers 13 has the shape of a band extending in the second direction y. The pair of gate layers 13 are electrically conductive. The pair of gate layers 13 are made of a material that contains copper, for example.

As shown in FIGS. 4, 9, and 10, one of the pair of detection layers 14 is arranged on the insulating layer 12 joined to the surface of the first conductive portion 11A, and the other is arranged on the insulating layer 12 joined to the surface of the second conductive portion 11B. Each of the pair of detection layers 14 is adjacent to a corresponding one of the pair of gate layers 13 in the first direction x. Each of the pair of detection layers 14 has the shape of a band extending in the second direction y. The pair of detection layers 14 are electrically conductive. The pair of detection layers 14 are made of a material that contains copper, for example.

As shown in FIGS. 2 to 6, the first input terminal 21 and the second input terminal 22 are located on the one side in the first direction x. A direct current voltage is applied to the first input terminal 21 and the second input terminal 22 via the bus bar C10. The first input terminal 21 serves as a positive electrode (P terminal). The second input terminal 22 serves as a negative electrode (N terminal). As shown in FIG. 10, the second input terminal 22 is spaced apart from both the first input terminal 21 and the conductive member 11 in the thickness direction z. The first input terminal 21 and the second input terminal 22 are metal plates. The metal plates are made of copper or a copper alloy.

As shown in FIG. 4, the first input terminal 21 includes a first pad portion 211 and a first terminal portion 212. The boundary between the first pad portion 211 and the first terminal portion 212 of the first input terminal 21 is a plane that extends in the second direction y and the thickness direction z and includes a first side surface 531 (described later in detail) of the sealing resin 50 that is located on the one side in the first direction x. The entire first pad portion 211 is covered by the sealing resin 50. A portion of the first pad portion 211 on the other side in the first direction x has the shape of comb teeth. This comb teeth-shaped portion is joined to the surface of the first conductive portion 11A in a state of being electrically connected thereto. This joining is performed through solder joining, ultrasonic joining, or the like. Thus, the first input terminal 21 is electrically connected to the first conductive portion 11A.

As shown in FIGS. 4 and 5, the first terminal portion 212 extends from the sealing resin 50 toward the one side in the first direction x. The first terminal portion 212 has a rectangular shape as viewed in the thickness direction z. Portions of the first terminal portion 212 on both sides in the second direction y are covered by the sealing resin 50. The other portion of the first terminal portion 212 is exposed from the sealing resin 50. Thus, the first input terminal 21 is supported by the sealing resin 50. Further, the first substrate 10A is supported by the first input terminal 21 via the first conductive portion 11A.

As shown in FIG. 3, the second input terminal 22 includes a second pad portion 221 and a second terminal portion 222. The boundary between the second pad portion 221 and the second terminal portion 222 of the second input terminal 22 coincides with the boundary between the first pad portion 211 and the first terminal portion 212 of the first input terminal 21. The second pad portion 221 includes a linkage portion 221A and a plurality of extension portions 221B. The linkage portion 221A has the shape of a band extending in the second direction y. The linkage portion 221A is continuous to the second terminal portion 222. The plurality of extension portions 221B each have the shape of a band extending from the linkage portion 221A toward the other side in the first direction x. The plurality of extension portions 221B are spaced apart from each other in the second direction y. As shown in FIG. 10, the plurality of extension portions 221B are bent as viewed in the second direction y. Surfaces of the plurality of extension portions 221B may be plated with silver, for example.

Figure 2:
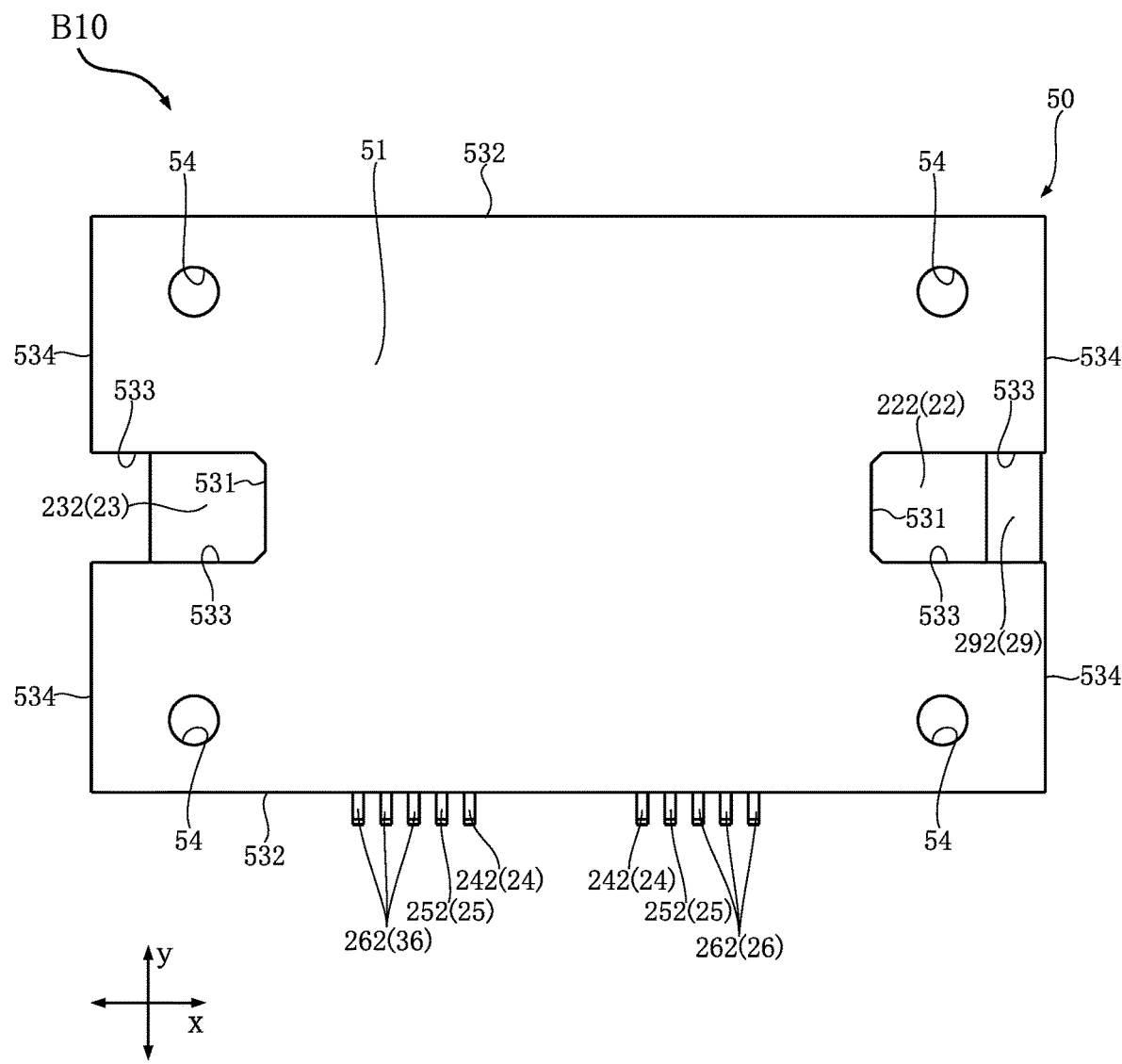
FIG. 2 is a plan view of a semiconductor device that is included in constituent elements of the semiconductor module shown in FIG. 1.
Figure 3:
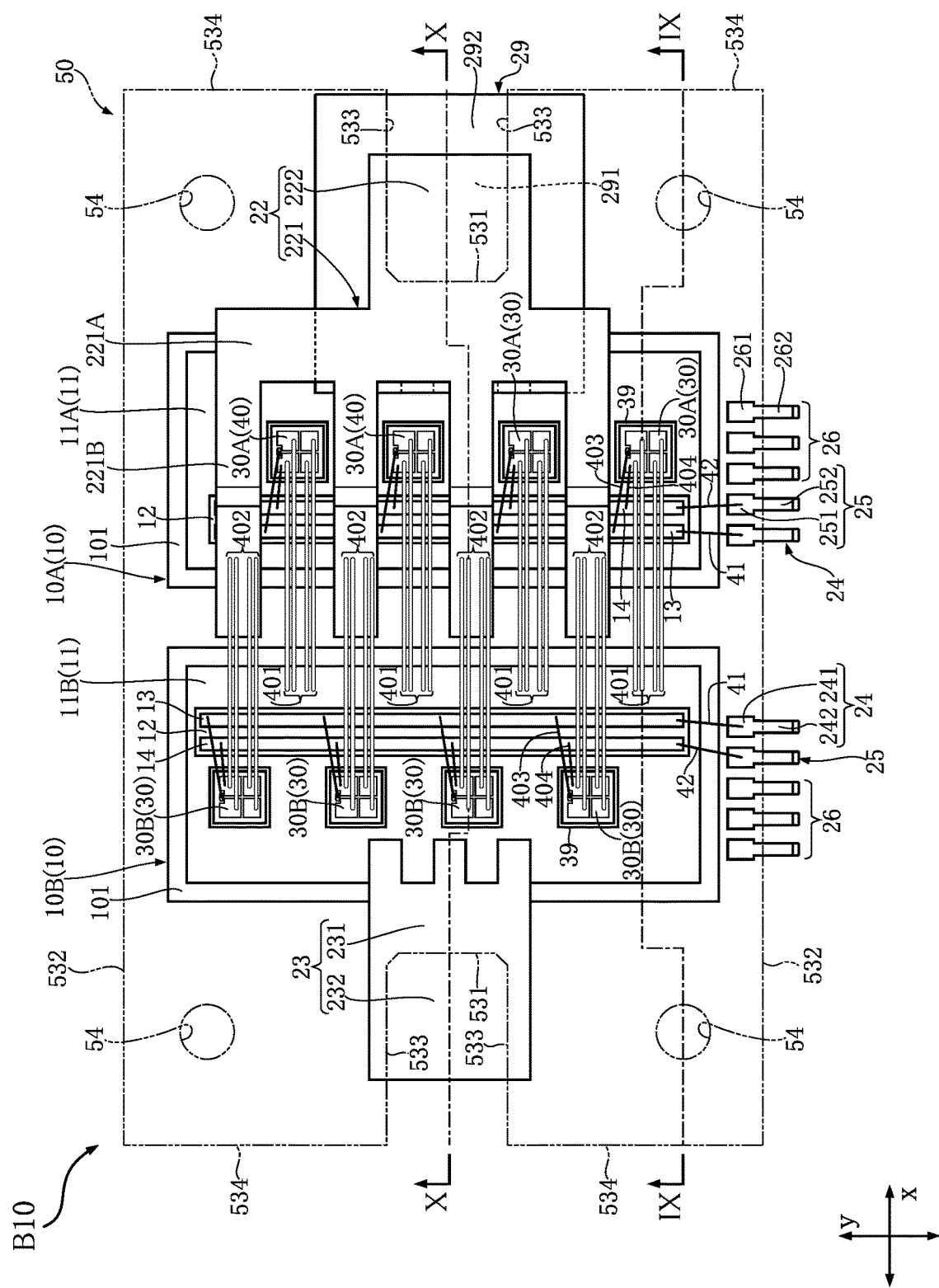
FIG. 3 is a plan view of the semiconductor device shown in FIG. 2, with a sealing resin being transparent.
Figure 4:
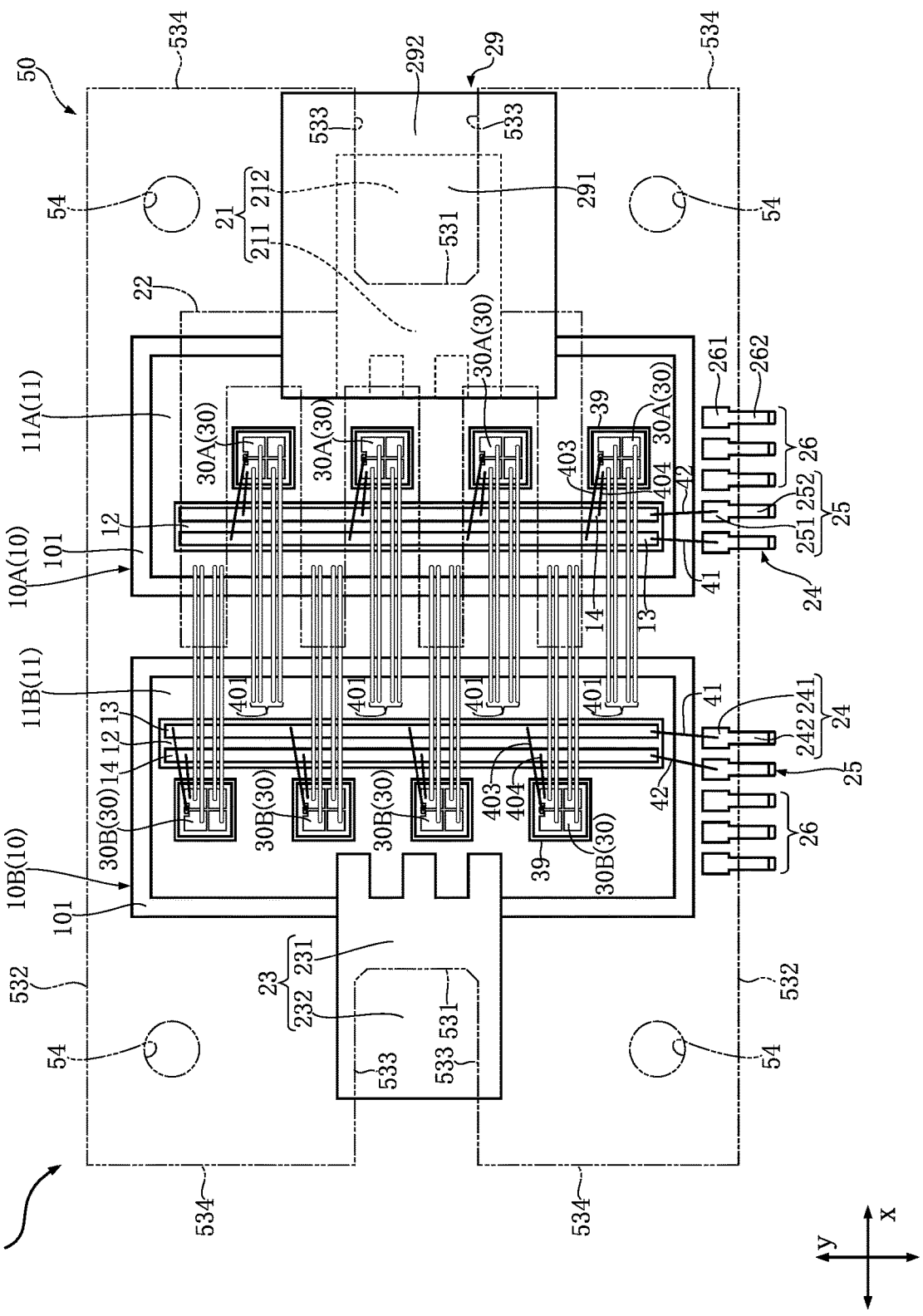
FIG. 4 is a plan view that corresponds to FIG. 3, with a second input terminal being transparent.

As shown in FIGS. 2 and 3, the second terminal portion 222 extends from the sealing resin 50 toward the one side in the first direction x. The second terminal portion 222 has a rectangular shape as viewed in the thickness direction z. Portions of the second terminal portion 222 on both sides in the second direction y are covered by the sealing resin 50. The other portion of the second terminal portion 222 is exposed from the sealing resin 50. As shown in FIGS. 3 and 4, the second terminal portion 222 overlaps with the first terminal portion 212 of the first input terminal 21 as viewed in the thickness direction z. As shown in FIG. 10, the second terminal portion 222 is spaced apart from the first terminal portion 212, on the side in the thickness direction z that the main surface 101 of the insulating substrate 10 faces. It should be noted that, in the semiconductor device B10, which is an example, the second terminal portion 222 has the same shape as the first terminal portion 212.

Figure 6:
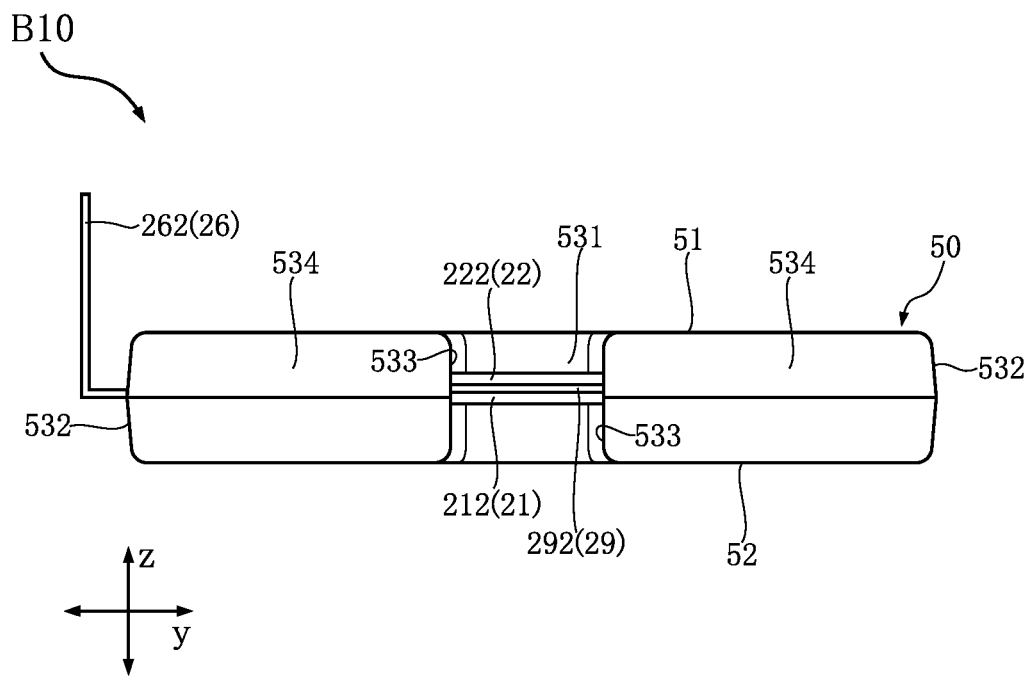
FIG. 6 is a right side view of the semiconductor device shown in FIG. 2.

As shown in FIGS. 6 and 10, an insulating member 29 is sandwiched between the first terminal portion 212 of the first input terminal 21 and the second terminal portion 222 of the second input terminal 22 in the thickness direction z. The insulating member 29 is a flat sheet. The insulating member 29 is constituted by insulating paper, for example. The entire first input terminal 21 overlaps with the insulating member 29 as viewed in the thickness direction z. At the second input terminal 22, a portion of the second pad portion 221 and the entire second terminal portion 222 are in contact with the insulating member 29 as viewed in the thickness direction z. These portions overlapping with the insulating member 29 as viewed in the thickness direction z are in contact with the insulating member 29. The first input terminal 21 and the second input terminal 22 are insulated from each other by the insulating member 29. Portions of the insulating member 29 (on the other side in the first direction x and on both sides in the second direction y) are covered by the sealing resin 50.

As shown in FIGS. 3, 4, and 10, the insulating member 29 includes an interposed portion 291 and an extension portion 292. The interposed portion 291 is located between the first terminal portion 212 of the first input terminal 21 and the second terminal portion 222 of the second input terminal 22 in the thickness direction z. The entire interposed portion 291 is sandwiched between the first terminal portion 212 and the second terminal portion 222. The extension portion 292 extends from the interposed portion 291 toward the one side in the first direction x past the first terminal portion 212 and the second terminal portion 222. Therefore, the extension portion 292 is located further toward the one side in the first direction x than the first terminal portion 212 and the second terminal portion 222. Portions of the extension portion 292 on both sides in the second direction y are covered by the sealing resin 50.

As shown in FIGS. 2 to 7 (excluding FIG. 6), the output terminal 23 is located on the other side in the first direction x. Alternating current power (voltage) that is obtained through power conversion by the plurality of switching elements 30 is output from the output terminal 23. The output terminal 23 is a metal plate. The metal plate is made of copper or a copper alloy. The output terminal 23 includes a pad portion 231 and a terminal portion 232. The boundary between the pad portion 231 and the terminal portion 232 is a plane that extends in the second direction y and the thickness direction z and includes a first side surface 531 (described later in detail) of the sealing resin 50 that is located on the other side in the first direction x. The entire pad portion 231 is covered by the sealing resin 50. A portion of the pad portion 231 on the one side in the first direction x has the shape of comb teeth. This comb teeth-shaped portion is joined to the surface of the second conductive portion 11B in a state of being electrically connected thereto. This joining is performed through solder joining, ultrasonic joining, or the like. Thus, the output terminal 23 is electrically connected to the second conductive portion 11B. As shown in FIGS. 2 to 5, the terminal portion 232 extends from the sealing resin 50 toward the other side in the first direction x. The terminal portion 232 has a rectangular shape as viewed in the thickness direction z. Portions of the terminal portion 232 on both sides in the second direction y are covered by the sealing resin 50. The other portion of the terminal portion 232 is exposed from the sealing resin 50. Thus, the output terminal 23 is supported by the sealing resin 50. Further, the second substrate 10B is supported by the output terminal 23 via the second conductive portion 11B.

As shown in FIGS. 3, 9, and 10, the plurality of switching elements 30 (the plurality of first elements 30A and the plurality of second elements 30B) are joined to the first conductive portion 11A and the second conductive portion 11B, which constitute the conductive member 11, in a state of being electrically connected thereto. The plurality of switching elements 30 are arranged in a staggered manner in the second direction y as viewed in the thickness direction z. Out of the plurality of switching elements 30, the plurality of first elements 30A constitute an upper arm circuit of the semiconductor device B10. The plurality of second elements 30B constitute a lower arm circuit of the semiconductor device B10. Each of the plurality of switching elements 30 has a rectangular shape (square shape in the semiconductor device B10) as viewed in the thickness direction z. In the semiconductor device B10, which is an example, the plurality of switching elements 30 are constituted by four first elements 30A and four second elements 30B. It should be noted that the number of switching elements 30 is not limited to that in this configuration and can be set freely according to the required performance of the semiconductor device B10.

The first elements 30A and the second elements 30B are metal-oxide-semiconductor field-effect transistors (MOS-FETs) that are obtained using a semiconductor material that contains silicon carbide (SiC) as the main component. It should be noted that the first elements 30A and the second elements 30B are not limited to MOSFETs and may be field-effect transistors including metal-insulator-semiconductor field-effect transistors (MISFETs) or bipolar transistors such as insulated gate bipolar transistors (IGBTs). In describing the semiconductor device B10, one example is described in which all of the first elements 30A and the second elements 30B are n-channel vertical MOSFETs.

Figure 11:
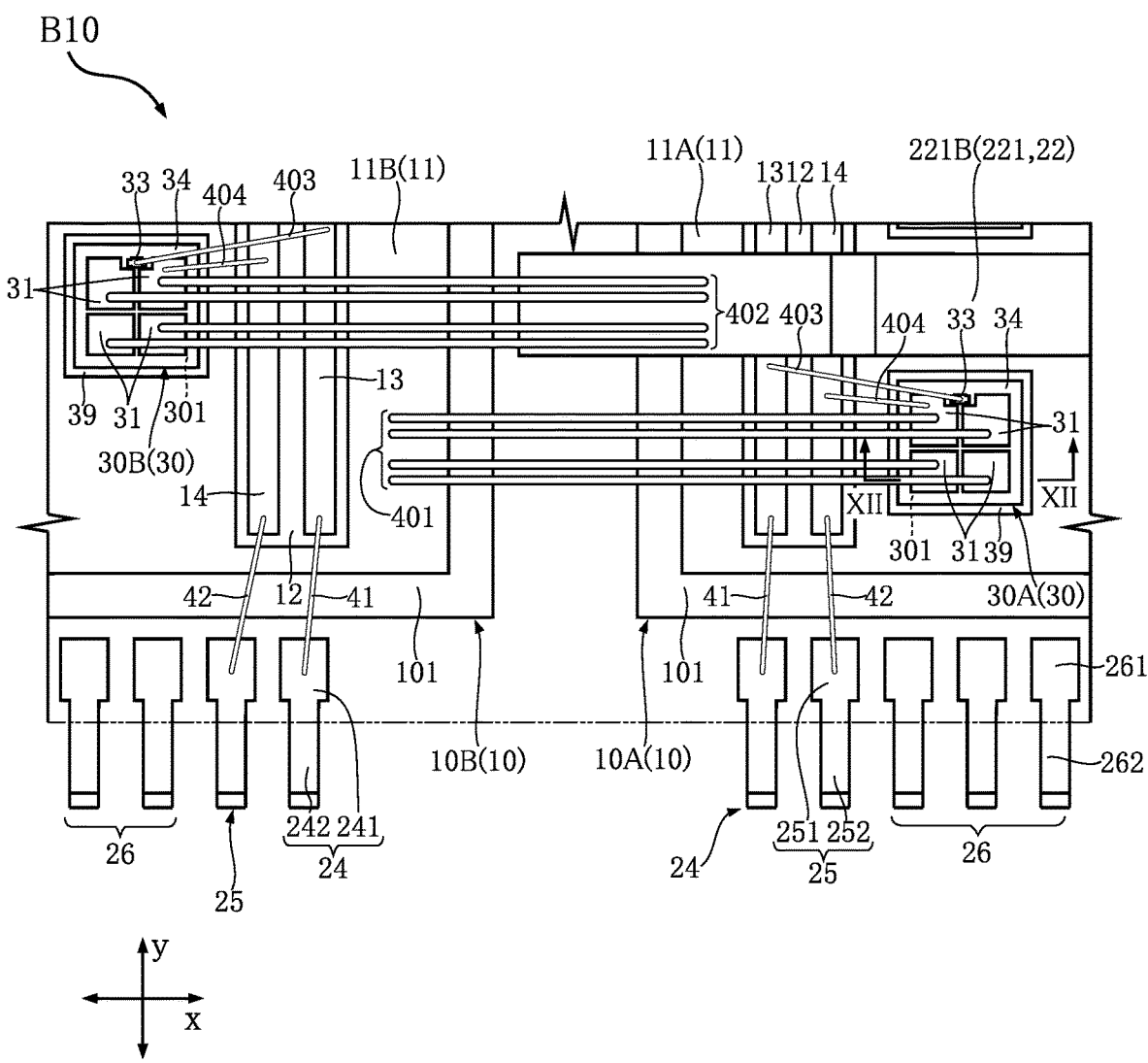
FIG. 11 is a partial enlarged view of FIG. 3.
Figure 12:
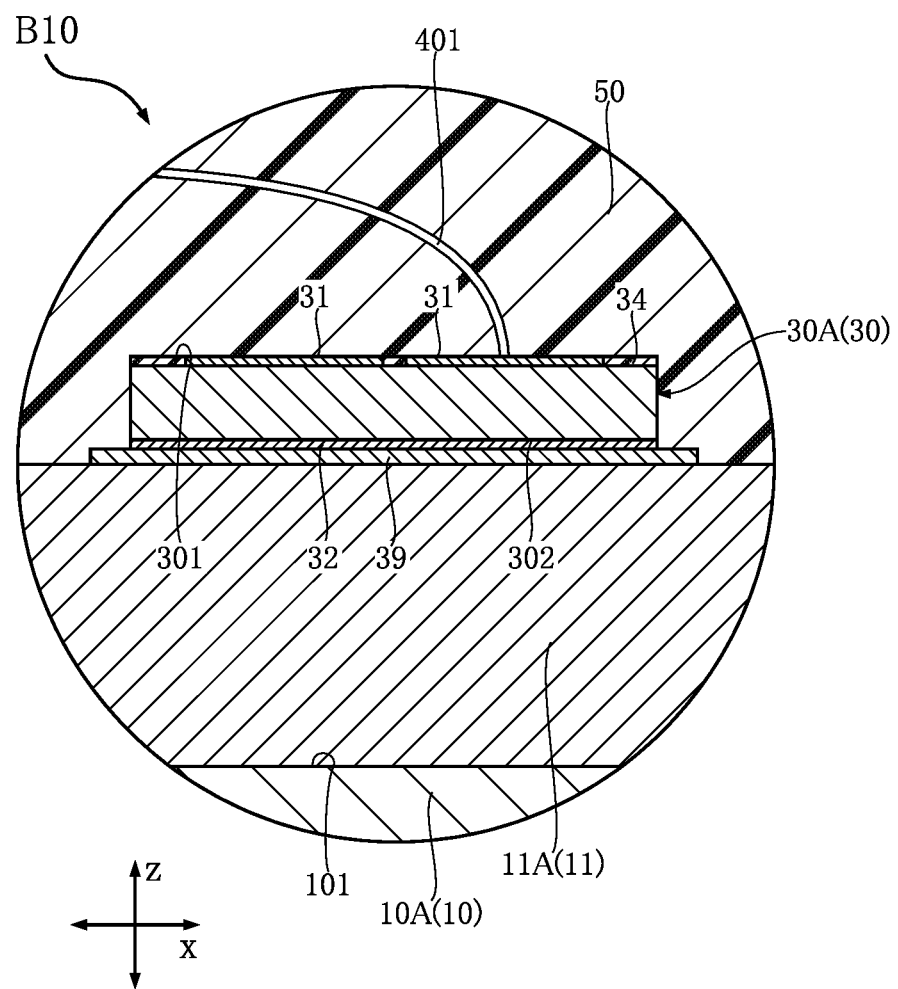
FIG. 12 is a cross-sectional view taken along a line XII-XII in FIG. 11.
Figure 13:
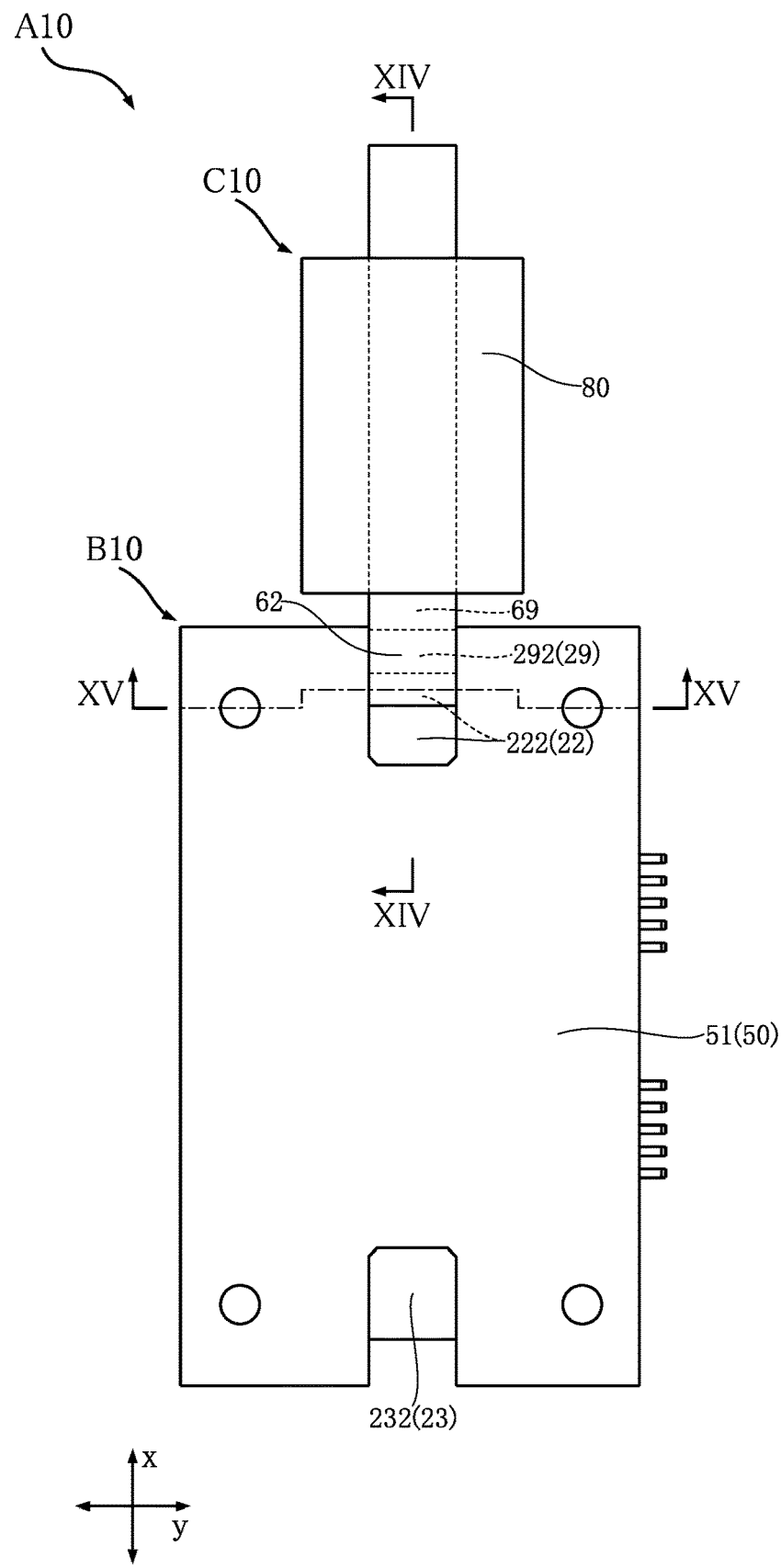
FIG. 13 is a plan view of the semiconductor module shown in FIG. 1.

As shown in FIGS. 11 and 12, each of the first elements 30A and the second elements 30B has a first surface 301, a second surface 302, a first electrode 31, a second electrode 32, a gate electrode 33, and an insulating film 34. The first surface 301 and the second surface 302 face opposite sides to each other in the thickness direction z. Out of these surfaces, the first surface 301 faces the side that the main surface 101 of the insulating substrate 10 faces.

As shown in FIGS. 11 and 12, the first electrode 31 is provided on the first surface 301. A source current flows through the first electrode 31. In the semiconductor device B10, which is an example, the first electrode 31 is divided into four regions.

As shown in FIG. 11, a plurality of first wires 401 are respectively connected to the four regions of the first electrode 31 of the first element 30A. The first wires 401 are made of aluminum, for example. A plurality of first wires 401 that are connected to the first electrodes 31 of the plurality of first elements 30A are connected to the surface of the second conductive portion 11B. Thus, the first electrodes 31 of the plurality of first elements 30A are electrically connected to the second conductive portion 11B. The plurality of first wires 401 extend in the first direction x.

As shown in FIG. 11, a plurality of second wires 402 are respectively connected to the four regions of the first electrode 31 of the second element 30B. The second wires 402 are made of aluminum, for example. A plurality of second wires 402 that are connected to the first electrodes 31 of the plurality of second elements 30B are connected to the surfaces of the plurality of extension portions 221B (second pad portion 221) of the second input terminal 22. Thus, the first electrodes 31 of the plurality of second elements 30B are electrically connected to the second input terminal 22. That is, the second input terminal 22 is electrically connected to the plurality of second elements 30B that constitute a portion of the plurality of switching elements 30. The plurality of second wires 402 extend in the first direction x.

As shown in FIG. 12, the second electrode 32 is provided over the entire second surface 302. A drain current flows through the second electrode 32. The second electrode 32 of the first element 30A is joined to the surface of the first conductive portion 11A in a state of being electrically connected thereto by a conductive joining layer 39 that is electrically conductive. The conductive joining layer 39 is made of lead-free solder that contains tin (Sn) as the main component, for example. The second electrode 32 of the second element 30B is joined to the surface of the second conductive portion 11B in a state of being electrically connected thereto by the conductive joining layer 39.

As shown in FIG. 11, the gate electrode 33 is provided on the first surface 301. A gate voltage for driving a corresponding one of the first elements 30A and the second elements 30B is applied to the gate electrode 33. The gate electrode 33 is smaller than the first electrode 31. Any one of a plurality of gate wires 403 is connected to the gate electrode 33. The gate wires 403 are made of aluminum, for example. A plurality of gate wires 403 that are respectively connected to the gate electrodes 33 of the plurality of first elements 30A are connected to the gate layer 13 that is arranged on the insulating layer 12 joined to the first conductive portion 11A. A plurality of gate wires 403 that are respectively connected to the gate electrodes 33 of the plurality of second elements 30B are connected to the gate layer 13 that is arranged on the insulating layer 12 joined to the second conductive portion 11B.

As shown in FIG. 11, in each of the first elements 30A and the second elements 30B, any one of a plurality of detection wires 404 is connected to the first electrode 31. The detection wire 404 is connected to any one of the four regions of the first electrode 31. The detection wires 404 are made of aluminum, for example. A plurality of detection wires 404 that are respectively connected to the first electrodes 31 of the plurality of first elements 30A are connected to the detection layer 14 that is arranged on the insulating layer 12 joined to the first conductive portion 11A. A plurality of detection wires 404 that are respectively connected to the first electrodes 31 of the plurality of second elements 30B are connected to the detection layer 14 that is arranged on the insulating layer 12 joined to the second conductive portion 11B.

As shown in FIGS. 11 and 12, the insulating film 34 is provided on the first surface 301. The insulating film 34 surrounds the first electrode 31 as viewed in the thickness direction z. The insulating film 34 is formed by, for example, stacking a silicon dioxide ($SiO_2$) layer, a silicon nitride ($Si_3N_4$) layer, and a polybenzoxazole (PBO) layer in this order on the first surface 301. It should be noted that, in the insulating film 34, the polybenzoxazole layer may be replaced with a polyimide layer.

As shown in FIG. 3, the pair of gate terminals 24, the pair of detection terminals 25, and the plurality of dummy terminals 26 are adjacent to the insulating substrate 10 in the second direction y. These terminals are arranged in the first direction x. In the semiconductor device B10, the pair of gate terminals 24, the pair of detection terminals 25, and the plurality of dummy terminals 26 are all constituted by the same lead frame.

As shown in FIG. 3, one of the pair of gate terminals 24 is adjacent to the first substrate 10A in the second direction y, and the other is adjacent to the second substrate 10B in the second direction y. A gate voltage for driving the plurality of first elements 30A and a gate voltage for driving the plurality of second elements 30B are each applied to a corresponding one of the pair of gate terminals 24. Each of the pair of gate terminals 24 includes a pad portion 241 and a terminal portion 242. The pad portion 241 is covered by the sealing resin 50. Thus, the pair of gate terminals 24 are supported by the sealing resin 50. It should be noted that a surface of the pad portion 241 may be plated with silver, for example. The terminal portion 242 is continuous to the pad portion 241 and is exposed from the sealing resin 50 (see FIG. 8). The terminal portion 242 has an L-shape as viewed in the first direction x.

As shown in FIG. 3, each of the pair of detection terminals 25 is adjacent to a corresponding one of the pair of gate terminals 24 in the first direction x. A voltage (voltage corresponding to the source current) applied to the first electrodes 31 of the plurality of first elements 30A and a voltage applied to the first electrodes 31 of the plurality of second elements 30B are each detected by a corresponding one of the pair of detection terminals 25. Each of the pair of detection terminals 25 includes a pad portion 251 and a terminal portion 252. The pad portion 251 is covered by the sealing resin 50. Thus, the pair of detection terminals 25 are supported by the sealing resin 50. It should be noted that a surface of the pad portion 251 may be plated with silver, for example. The terminal portion 252 is continuous to the pad portion 251 and is exposed from the sealing resin 50 (see FIG. 8). The terminal portion 252 has an L-shape as viewed in the first direction x.

Figure 7:
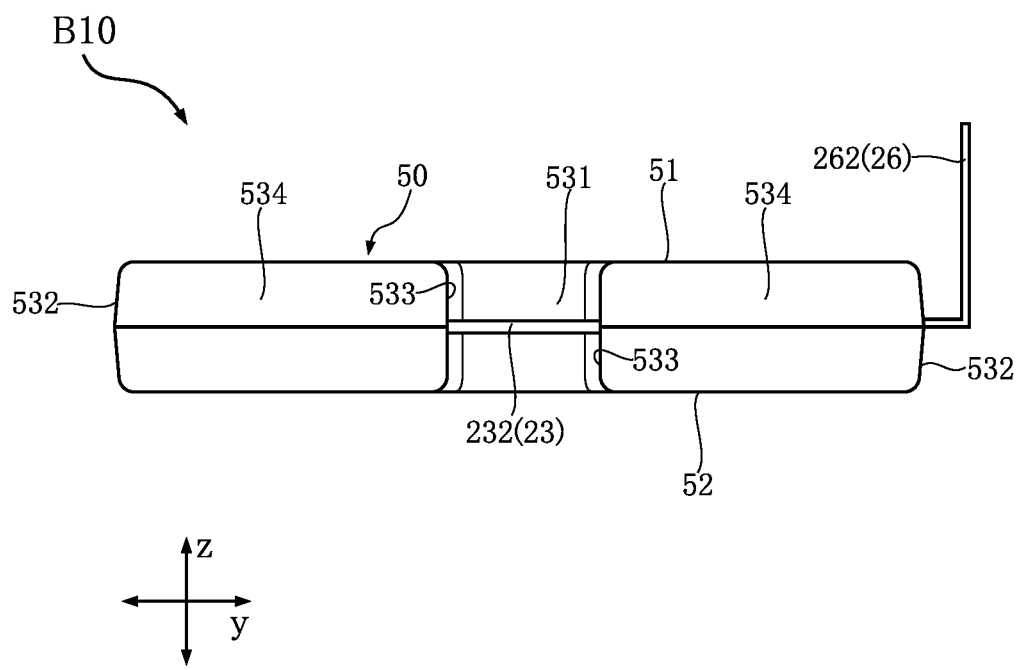
FIG. 7 is a left side view of the semiconductor device shown in FIG. 2.
Figure 8:
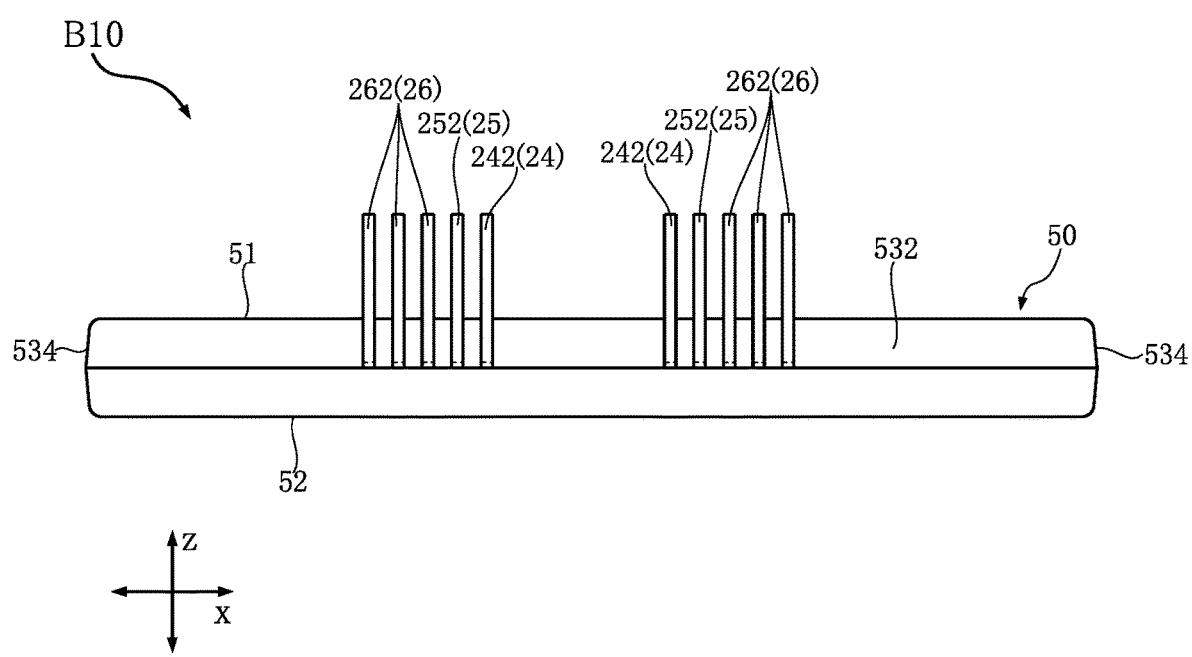
FIG. 8 is a front view of the semiconductor device shown in FIG. 2.

As shown in FIG. 3, the plurality of dummy terminals 26 are located on the sides opposite to the pair of gate terminals 24 with respect to the pair of detection terminals 25 in the first direction x. The semiconductor device B10, which is an example, includes six dummy terminals 26. Out of the six dummy terminals 26, three dummy terminals are located on the one side in the first direction x. The remaining three dummy terminals 26 are located on the other side in the first direction x. It should be noted that the number of dummy terminals 26 is not limited to that in this configuration. Further, the semiconductor device B10 may also have a configuration that does not include the plurality of dummy terminals 26. Each of the plurality of dummy terminals 26 includes a pad portion 261 and a terminal portion 262. The pad portion 261 is covered by the sealing resin 50. Thus, the plurality of dummy terminals 26 are supported by the sealing resin 50. It should be noted that a surface of the pad portion 261 may be plated with silver, for example. The terminal portion 262 is continuous to the pad portion 261 and is exposed from the sealing resin 50 (see FIG. 8). As shown in FIGS. 6 and 7, the terminal portion 262 has an L-shape as viewed in the first direction x. It should be noted that the terminal portions 242 of the pair of gate terminals 24 and the terminal portions 252 of the pair of detection terminals 25 each have the same shape as the terminal portion 262.

As shown in FIGS. 3 and 11, the semiconductor device B10 includes one pair of first connection wires 41 and one pair of second connection wires 42. The pair of first connection wires 41 and the pair of second connection wires 42 are made of aluminum, for example.

As shown in FIGS. 3 and 11, each of the pair of first connection wires 41 is connected to a corresponding one of the pair of gate layers 13 and a corresponding one of the pair of gate terminals 24. The pair of first connection wires 41 are connected to surfaces of the pair of pad portions 241 of the pair of gate terminals 24. Thus, the gate terminal 24 that is adjacent to the first substrate 10A in the second direction y is electrically connected to the gate electrodes 33 of the plurality of first elements 30A. The gate terminal 24 that is adjacent to the second substrate 10B in the second direction y is electrically connected to the gate electrodes 33 of the plurality of second elements 30B.

As shown in FIGS. 3 and 11, each of the pair of second connection wires 42 is connected to a corresponding one of the pair of detection layers 14 and a corresponding one of the pair of detection terminals 25. The pair of second connection wires 42 are connected to surfaces of the pair of pad portions 251 of the pair of detection terminals 25. Thus, the detection terminal 25 that is adjacent to the first substrate 10A in the second direction y is electrically connected to the first electrodes 31 of the plurality of first elements 30A. The detection terminal 25 that is adjacent to the second substrate 10B in the second direction y is electrically connected to the first electrodes 31 of the plurality of second elements 30B.

As shown in FIGS. 9 and 10, the sealing resin of back surfaces 102), the conductive member 11, and the plurality of switching elements 30 (the plurality of first elements 30A and the plurality of second elements 30B). The sealing resin 50 further covers the plurality of first wires 401, the plurality of second wires 402, the plurality of gate wires 403, the plurality of detection wires 404, the pair of first connection wires 41, and the pair of second connection wires 42. The sealing resin 50 is made of a material that contains an epoxy resin, for example. As shown in FIGS. 2 and 5 to 8, the sealing resin 50 has a top surface 51, a bottom surface 52, one pair of first side surfaces 531, one pair of second side surfaces 532, a plurality of third side surfaces 533, a plurality of fourth side surfaces 534, and a plurality of attachment holes 54.

As shown in FIGS. 9 and 10, the top surface 51 faces the side in the thickness direction z that the main surface 101 of the insulating substrate 10 faces. The bottom surface 52 faces the side in the thickness direction z that the back surface 102 of the insulating substrate 10 faces. As shown in FIG. 5, the pair of back surfaces 102 are exposed from the bottom surface 52. The bottom surface 52 has the shape of a frame that surrounds the pair of back surfaces 102.

As shown in FIGS. 2 and 5 to 7, the pair of first side surfaces 531 are continuous to both the top surface 51 and the bottom surface 52 and face the first direction x. The first terminal portion 212 of the first input terminal 21 and the second terminal portion 222 of the second input terminal 22 extend toward the one side in the first direction x from a first side surface 531 that is located on the one side in the first direction x. The terminal portion 232 of the output terminal 23 extends toward the other side in the first direction x from a first side surface 531 that is located on the other side in the first direction x.

As shown in FIGS. 2 and 5 to 8, the pair of second side surfaces 532 are continuous to both the top surface 51 and the bottom surface 52 and face the second direction y. The terminal portions 242 of the pair of gate terminals 24, the terminal portions 252 of the pair of detection terminals 25, and the terminal portions 262 of the plurality of dummy terminals 26 are exposed from either of the pair of second side surfaces 532.

As shown in FIGS. 2 and 5 to 7, the plurality of third side surfaces 533 are continuous to both the top surface 51 and the bottom surface 52 and face the second direction y. The plurality of third side surfaces 533 include one pair of third side surfaces 533 that are located on the one side in the first direction x and one pair of third side surfaces 533 that are located on the other side in the first direction x. On each of the one side and the other side in the first direction x, the pair of third side surfaces 533 are located opposite to each other in the second direction y. Also, on each of the one side and the other side in the first direction x, the pair of third side surfaces 533 are continuous to both sides of the first side surface 531 in the second direction y.

As shown in FIGS. 2 and 5 to 8, the plurality of fourth side surfaces 534 are continuous to both the top surface 51 and the bottom surface 52 and face the first direction x. The plurality of fourth side surfaces 534 are located further outward from the semiconductor device B10 than the pair of first side surfaces 531 in the first direction x. The plurality of fourth side surfaces 534 include one pair of fourth side surfaces 534 that are located on the one side in the first direction x and one pair of fourth side surfaces 534 that are located on the other side in the first direction x. On each of the one side and the other side in the first direction x, each of the pair of fourth side surfaces 534 is continuous, on both sides thereof in the second direction y, to a corresponding one of the pair of second side surfaces 532 and a corresponding one of the pair of third side surfaces 533.

As shown in FIG. 9, the plurality of attachment holes 54 extend from the top surface 51 to the bottom surface 52 in the thickness direction z, passing through the sealing resin 50. The attachment holes 54 are used to attach the semiconductor device B10 to a heat sink (not shown). As shown in FIGS. 2 and 5, hole edges of the attachment holes 54 each have a circular shape as viewed in the thickness direction z. The attachment holes 54 are located at four corners of the sealing resin 50 as viewed in the thickness direction z.

<Bus Bar C10>

The following describes the bus bar C10 included in constituent elements of the semiconductor module A10. The bus bar C10 includes a first supply terminal 61, a second supply terminal 62, an insulator 69, and a molding resin portion 80.

Figure 14:
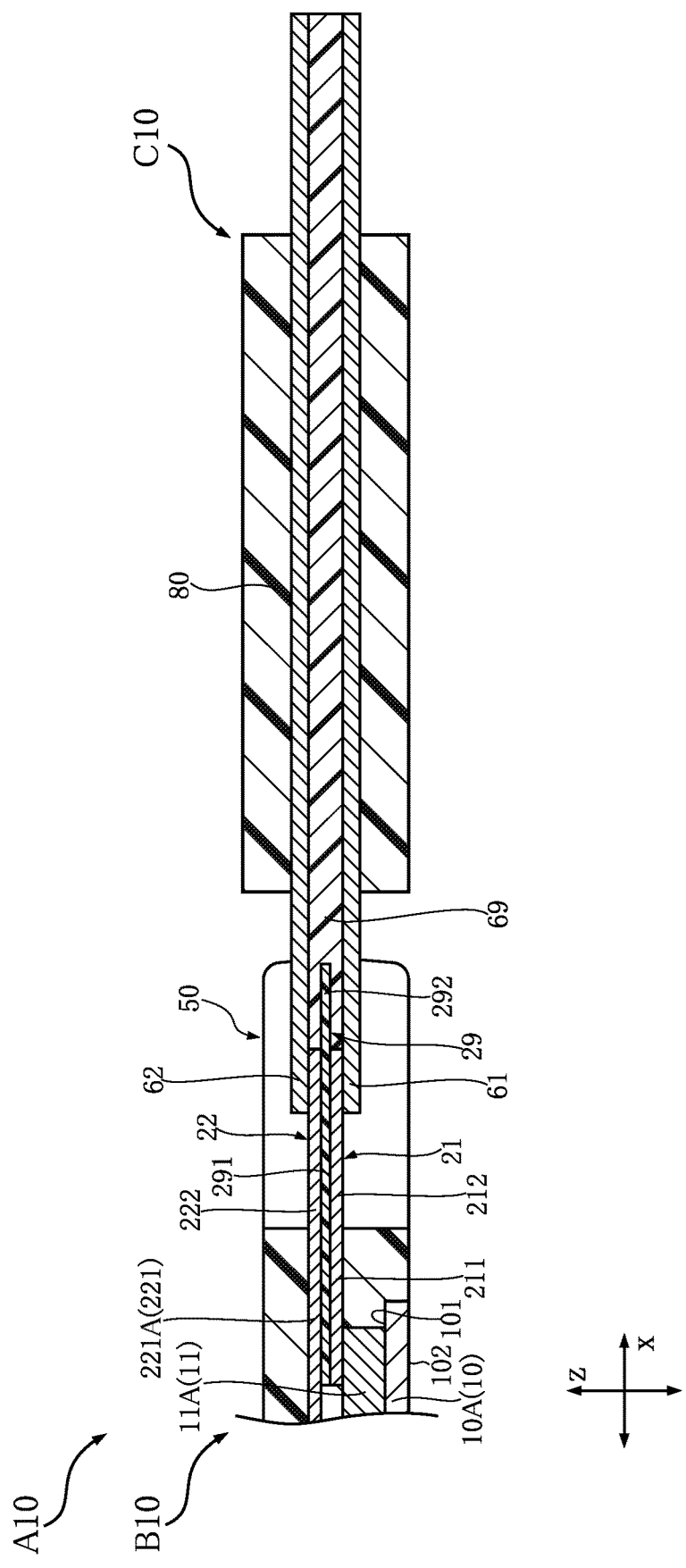
FIG. 14 is a cross-sectional view taken along a line XIV-XIV in FIG. 13.
Figure 15:
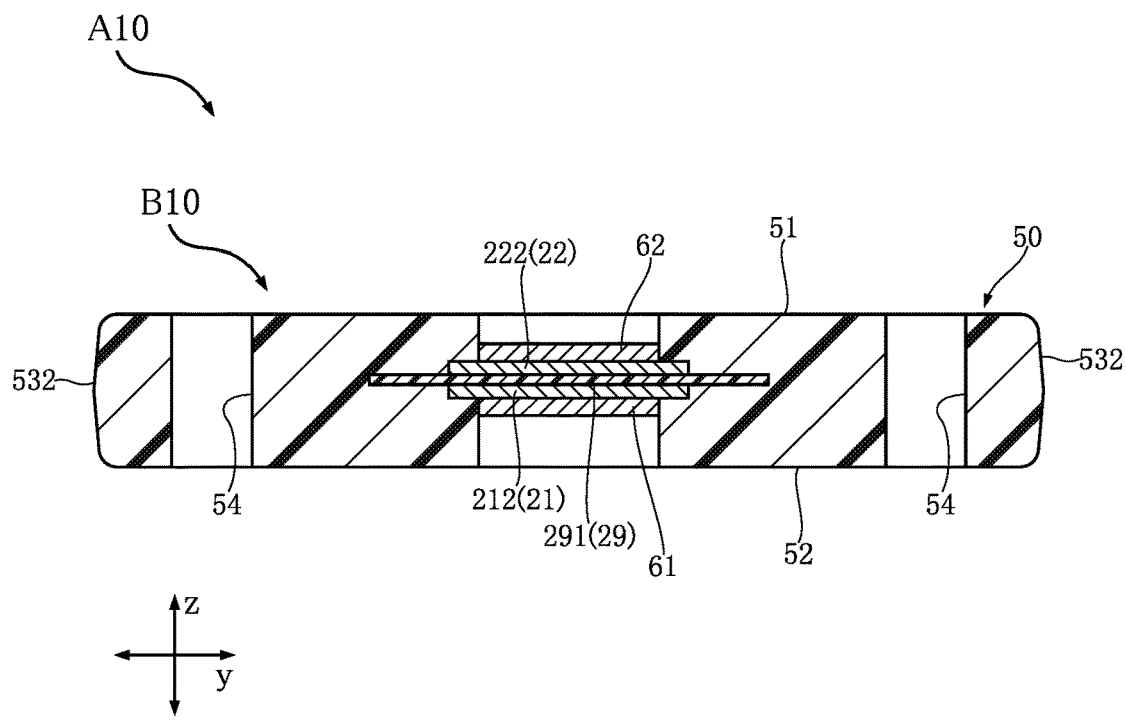
FIG. 15 is a cross-sectional view taken along a line XV-XV in FIG. 13.

As shown in FIGS. 13 to 15, the first supply terminal 61 and the second supply terminal 62 each have the shape of a band extending in the first direction x. The second supply terminal 62 is spaced apart from the first supply terminal 61, on the side in the thickness direction z that the main surface 101 of the insulating substrate 10 faces. The second supply terminal 62 overlaps with the first supply terminal 61 as viewed in the thickness direction z. In the bus bar C10, which is an example, the first supply terminal 61 and the second supply terminal 62 have the same shape as each other. The first supply terminal 61 and the second supply terminal 62 are metal plates. The metal plates are made of copper or a copper alloy.

Figure 16:
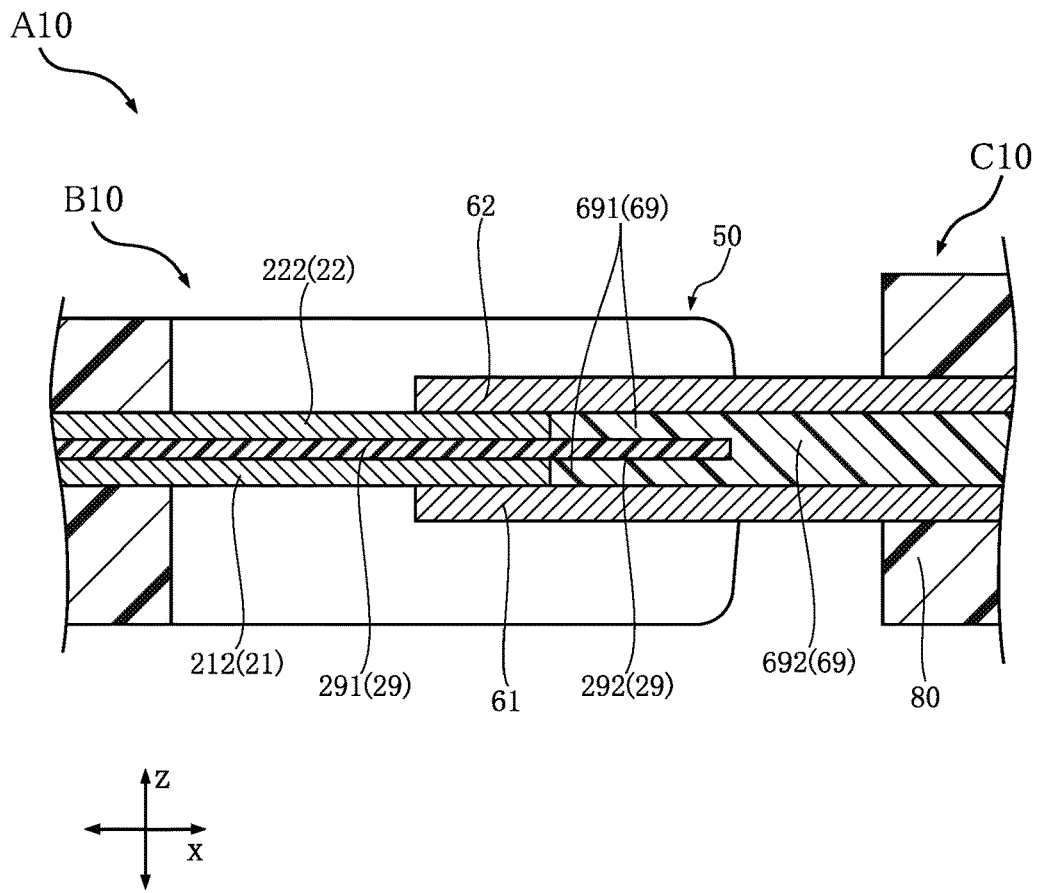
FIG. 16 is a partial enlarged view of FIG. 14.

As shown in FIG. 14, the insulator 69 is sandwiched between the first supply terminal 61 and the second supply terminal 62 in the thickness direction z. As shown in FIG. 16, the insulator 69 is located further toward the one side in the first direction x than respective leading ends of the first supply terminal 61 and the second supply terminal 62 that are located on the other side in the first direction x. The insulator 69 is made of a material that contains a glass epoxy resin, for example. The first supply terminal 61 is in contact with the insulator 69, on the side in the thickness direction z that the back surface 102 of the insulating substrate 10 faces. The second supply terminal is in contact with the insulator 69, on the side in the thickness direction z that the main surface 101 of the insulating substrate 10 faces. In this configuration, the first supply terminal 61 and the second supply terminal 62 overlap with each other as viewed in the thickness direction z, and constitute laminated wiring in a state of being electrically insulated from each other by the insulator 69.

As shown in FIG. 16, the insulator 69 includes one pair of separated portions 691 and a base portion 692. In the insulator 69, the pair of separated portions 691 are located on the other side in the first direction x. The pair of separated portions 691 are spaced apart from each other in the thickness direction z. Accordingly, there is a space between the pair of separated portions 691 in the thickness direction z. The base portion 692 is the portion of the insulator 69 other than the pair of separated portions 691. The base portion 692 is thicker than each of the pair of separated portions 691. The base portion 692 is continuous to both of the pair of separated portions 691 on the other side in the first direction x.

As shown in FIGS. 13 and 14, the molding resin portion 80 covers respective portions of the first supply terminal 61, the second supply terminal 62, and the insulator 69. The material of the molding resin portion 80 is a synthetic resin that has electrical insulating properties such as an epoxy resin. Respective portions of the first supply terminal 61, the second supply terminal 62, and the insulator 69 protrude from both sides of the molding resin portion 80 in the first direction x. It should be noted that the bus bar C10 may also have a configuration that does not include the molding resin portion 80.

<Semiconductor Module A10>

The following describes the semiconductor module A10.

As shown in FIG. 16, in the semiconductor module A10, the first supply terminal 61 is joined to the first terminal portion 212 of the first input terminal 21 in a state of being electrically connected thereto, and the second supply terminal 62 is joined to the second terminal portion 222 of the second input terminal 22 in a state of being electrically connected thereto. As shown in FIGS. 15 and 16, a portion of the first supply terminal 61 on the other side in the first direction x is overlaid by the first terminal portion 212. A portion of the second supply terminal 62 on the other side in the first direction x is overlaid on the second terminal portion 222. In this case, the extension portion 292 of the insulating member 29 is inserted into the space that is provided between the pair of separated portions 691 of the insulator 69 in the thickness direction z. The first supply terminal 61 and the second supply terminal 62 are respectively joined to the first terminal portion 212 and the second terminal portion 222 through laser welding in a state of being electrically connected thereto.

In the semiconductor module A10, the first supply terminal 61 serves as a positive electrode and the second supply terminal 62 serves as a negative electrode. As a result of portions of the first supply terminal 61 and the second supply terminal 62 on the one side in the first direction x being connected to a direct current power source DC as shown in FIGS. 17 and 18, direct current power is supplied via the bus bar C10 to the semiconductor device B10.

First Variation of First Embodiment

Figure 17:
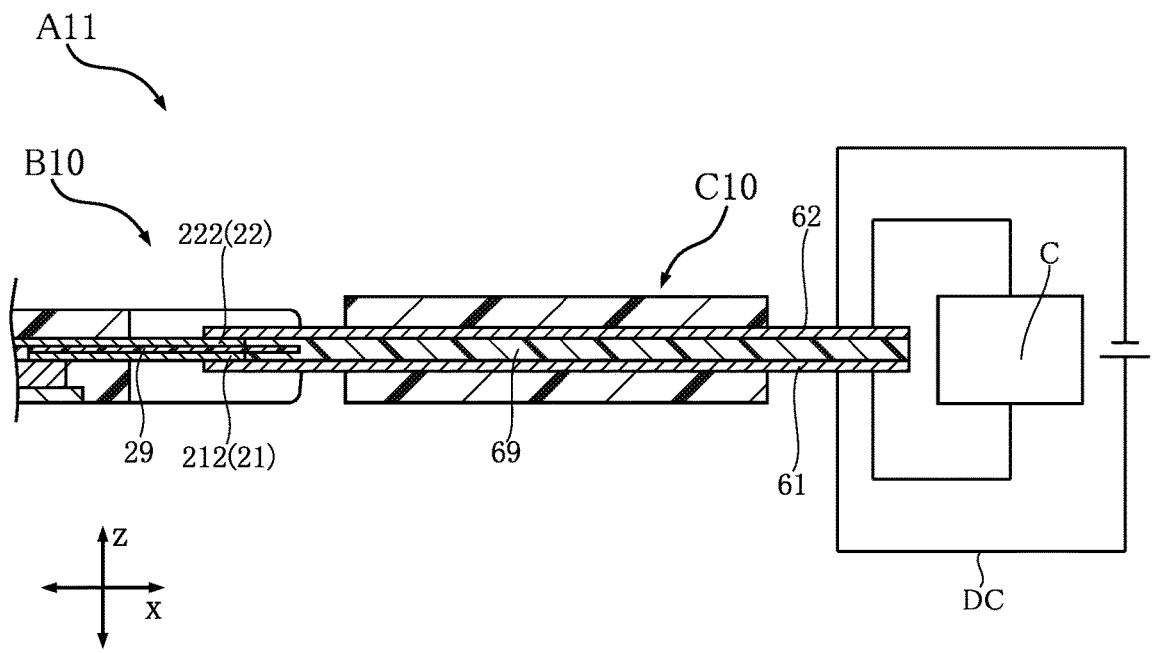
FIG. 17 is a cross-sectional view of a semiconductor module according to a first variation of the first embodiment of the present disclosure.
Figure 18:
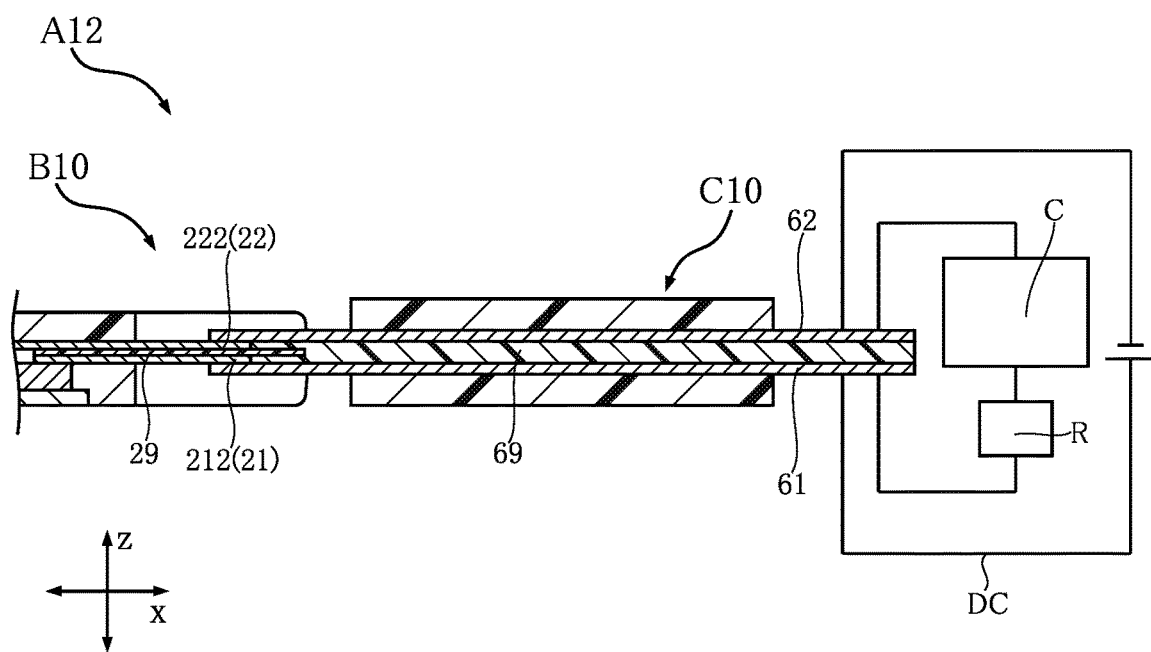
FIG. 18 is a cross-sectional view of a semiconductor module according to a second variation of the first embodiment of the present disclosure.

The following describes a semiconductor module A11 according to a first variation of the first embodiment of the present disclosure based on FIG. 17. The semiconductor module A11 further includes a capacitor C, compared to the semiconductor module A10.

As shown in FIG. 17, portions of the first supply terminal 61 and the second supply terminal 62 on the one side in the first direction x are connected to the direct current power source DC for supplying direct current power to the semiconductor device B10. The capacitor C is connected in parallel to the first supply terminal 61 and the second supply terminal 62 that are connected to the direct current power source DC. The capacitor C is a ceramic capacitor, a film capacitor, or the like. The capacitance of the capacitor C is set according to frequency characteristics of the semiconductor device B10.

Second Variation of First Embodiment

The following describes a semiconductor module A12 according to a second variation of the first embodiment of the present disclosure based on FIG. 18. The semiconductor module A12 further includes a resistor R, compared to the semiconductor module A11.

As shown in FIG. 18, portions of the first supply terminal 61 and the second supply terminal 62 on the one side in the first direction x are connected to the direct current power source DC for supplying direct current power to the semiconductor device B10. The capacitor C is connected in parallel to the first supply terminal 61 and the second supply terminal 62 that are connected to the direct current power source DC. The resistor R is connected to the capacitor C in series. On the conduction path between the first supply terminal 61, the second supply terminal 62, and the capacitor C, the resistor R is connected between the first supply terminal 61 and the capacitor C. Thus, a snubber circuit is formed in the semiconductor module A12.

Next, functions and effects of the semiconductor module A10 will be described.

The semiconductor module A10 includes, as constituent elements, the semiconductor device B10 that includes the first input terminal 21 having the first terminal portion 212 and the second input terminal 22 having the second terminal portion 222, and the bus bar C10 that includes the first supply terminal 61 and the second supply terminal 62. The second terminal portion 222 is spaced apart from the first terminal portion 212 in the thickness direction z and overlaps with the first terminal portion 212 as viewed in the thickness direction z. The second supply terminal 62 is spaced apart from the first supply terminal 61 in the thickness direction z and overlaps with the first supply terminal 61 as viewed in the thickness direction z. The first supply terminal 61 is joined to the first terminal portion 212 in a state of being electrically connected thereto, and the second supply terminal 62 is joined to the second terminal portion 222 in a state of being electrically connected thereto. Thus, continuous laminated wiring is realized in the semiconductor module A10 by the first terminal portion 212, the first supply terminal 61, the second terminal portion 222, and the second supply terminal 62. Since direct current power is supplied via the laminated wiring to the semiconductor device B10, inductance generated in the semiconductor device B10 can be more stably reduced by the laminated wiring. Therefore, inductance of the semiconductor device B10 can be more stably reduced in the semiconductor module A10.

The semiconductor device B10 further includes the insulating member 29 that is sandwiched between the first terminal portion 212 and the second terminal portion 222 in the thickness direction z. Therefore, laminated wiring can be easily realized by the first terminal portion 212 and the second terminal portion 222.

The bus bar C10 further includes the insulator 69 that is sandwiched between the first supply terminal 61 and the second supply terminal 62 in the thickness direction z. Therefore, laminated wiring can be easily realized by the first supply terminal 61 and the second supply terminal 62. Furthermore, the insulator 69 is located further toward the one side in the first direction x than the respective leading ends of the first supply terminal 61 and the second supply terminal 62 that are located on the other side in the first direction x. Therefore, a space is formed between portions of the first supply terminal 61 and the second supply terminal 62 that are located on the other side in the first direction x. By inserting portions of the first terminal portion 212 and the second terminal portion 222 on the one side in the first direction x into this space, a configuration can be realized in which the first terminal portion 212 and the second terminal portion 222 are sandwiched between the first supply terminal 61 and the second supply terminal 62 in the thickness direction z. In other words, the semiconductor module A10 can have a configuration in which the first supply terminal 61 is overlaid by the first terminal portion 212 and the second supply terminal 62 is overlaid on the second terminal portion 222.

The first supply terminal 61 and the second supply terminal 62 are respectively joined to the first terminal portion 212 and the second terminal portion 222 through laser welding in a state of being electrically connected thereto. Even if the first supply terminal 61 is overlaid by the first terminal portion 212 and the second supply terminal 62 is overlaid on the second terminal portion 222, if laser welding is adopted, the first supply terminal 61 and the second supply terminal 62 can be easily joined to the respective terminal portions in a state where electrical connection is ensured.

The insulating member 29 includes the extension portion 292 that extends from the interposed portion 291 toward the one side in the first direction x past the first terminal portion 212 and the second terminal portion 222. The insulator 69 includes the pair of separated portions 691 that are spaced apart from each other in the thickness direction z. As shown in FIG. 16, the extension portion 292 is inserted into the space that is provided between the pair of separated portions 691 in the thickness direction z. With this configuration, inclination of the semiconductor device B10 and the bus bar C10 relative to the first direction x can be suppressed when portions of the first terminal portion 212 and the second terminal portion 222 on the one side in the first direction x are inserted into the space between the first supply terminal 61 and the second supply terminal 62. Therefore, the state of contact between the first terminal portion 212 and the first supply terminal 61 and the state of contact between the second terminal portion 222 and the second supply terminal 62 can be more stable.

The semiconductor module A11 (see FIG. 17) further includes the capacitor C that is connected in parallel to the first supply terminal 61 and the second supply terminal 62. When the plurality of switching elements 30 of the semiconductor device B10 are driven, a counter electromotive force that causes the generation of inductance is generated at the first input terminal 21 and the second input terminal 22. The capacitor C functions to store the counter electromotive force as electric charge. Therefore, inductance of the semiconductor device B10 can be more effectively reduced. It should be noted that electric charge stored in the capacitor C is utilized as a portion of direct current power to be supplied to the semiconductor device B10.

The semiconductor module A12 (see FIG. 18) further includes the capacitor C that is connected in parallel to the first supply terminal 61 and the second supply terminal 62, and the resistor R that is connected to the capacitor C in series. The resistor R is capable of stepping down the voltage of the counter electromotive force generated at the first input terminal and the second input terminal 22. Therefore, excessive charging of the capacitor C can be prevented.

The semiconductor device B10 includes the sealing resin 50 that covers the plurality of switching elements 30 such that the back surface 102 of the insulating substrate 10 is exposed. With this configuration, the back surface 102 can be joined to a heat sink, and therefore heat dissipation of the semiconductor device B10 can be improved. Furthermore, respective portions of the first terminal portion 212, the second terminal portion 222, and the insulating member 29 are covered by the sealing resin 50. Therefore, the first input terminal 21, the second input terminal 22, and the insulating member 29 can be supported by the sealing resin 50.

Second Embodiment

The following describes a semiconductor module A20 according to a second embodiment of the present disclosure based on FIGS. 19 to 24. In these figures, elements that are the same as or similar to those of the above-described semiconductor module A10 are denoted with the same reference signs as those used in the semiconductor module A10, and a redundant description will be omitted. The semiconductor module A20 includes a semiconductor device B10 and a bus bar C20. Out of these, the configuration of the bus bar C20 differs from that in the above-described semiconductor module A10. It should be noted that the configuration of the semiconductor device B10 is the same as that in the above-described semiconductor module A10, and therefore a description thereof is omitted. It should be noted that a molding resin portion 80 is transparent in FIGS. 20 and 21 for convenience of understanding.

<Bus Bar C20>

The following describes the bus bar C20 included in constituent elements of the semiconductor module A20. The bus bar C20 includes a first supply terminal 61, a second supply terminal 62, an insulator 69, an insulating base 70, a first conductive layer 71, a second conductive layer 72, and the molding resin portion 80.

Figure 21:
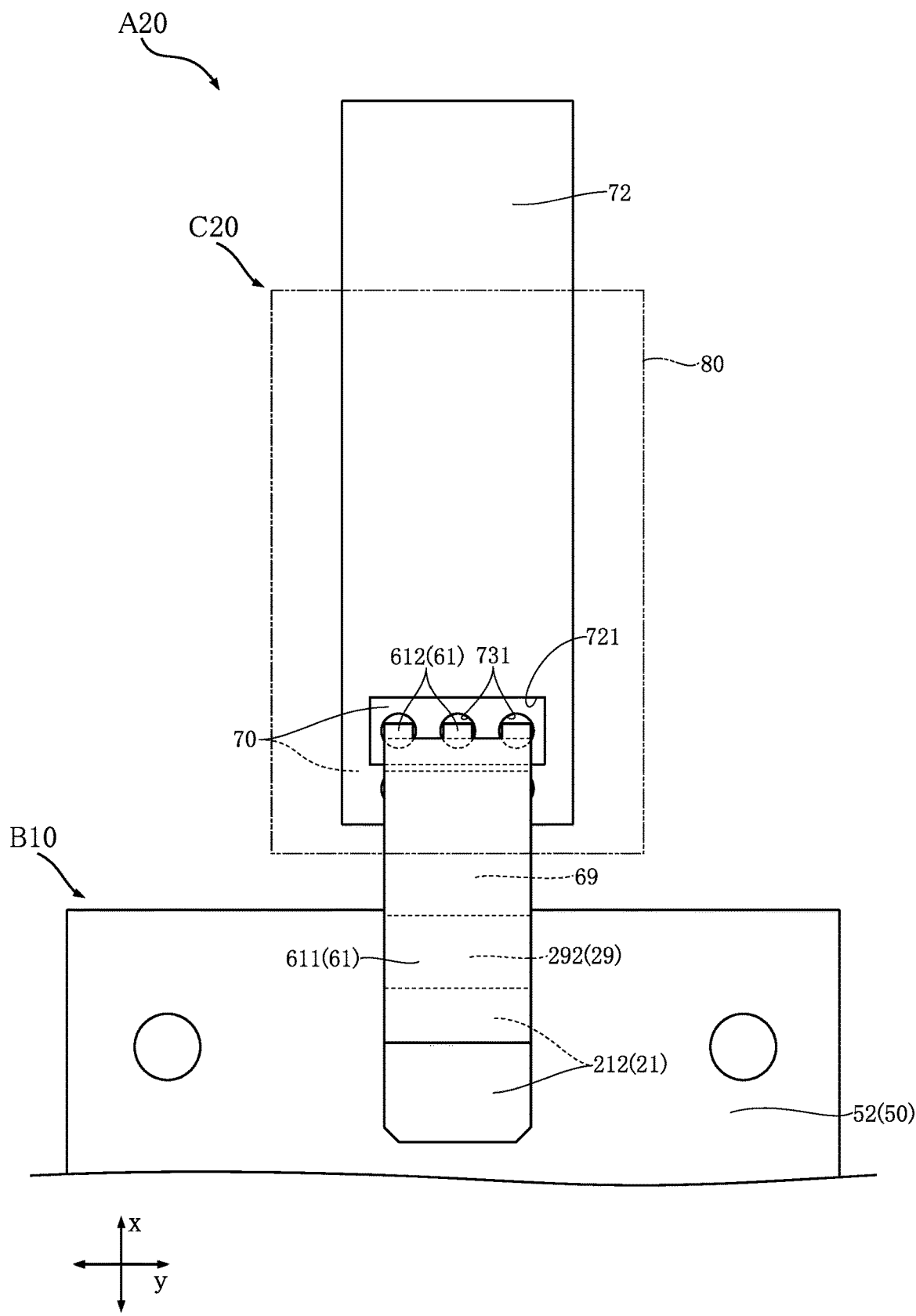
FIG. 21 is a partial enlarged bottom view of the semiconductor module shown in FIG. 19, with the molding resin portion being transparent.
Figure 22:
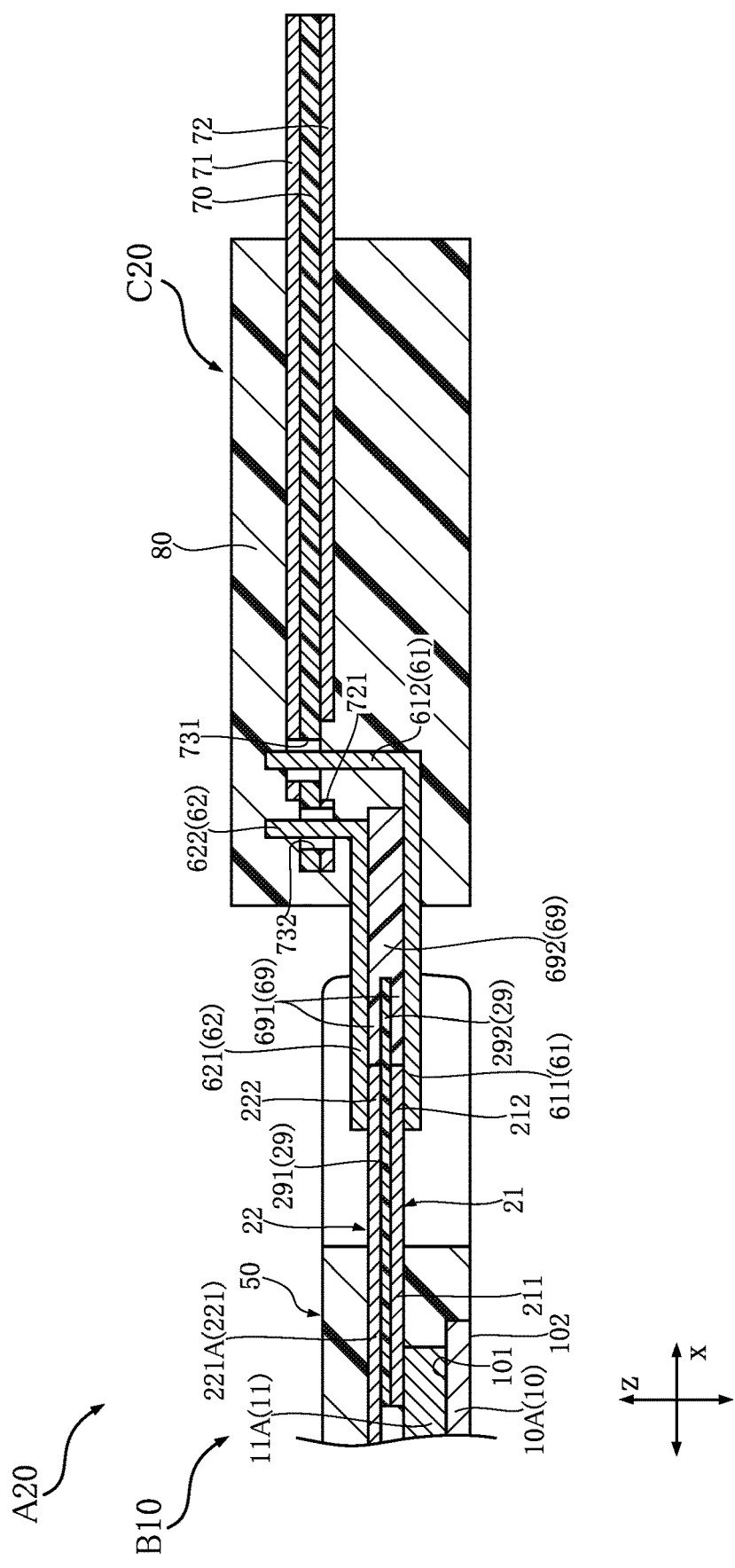
FIG. 22 is a cross-sectional view taken along a line XXII-XXII in FIG. 19.
Figure 24:
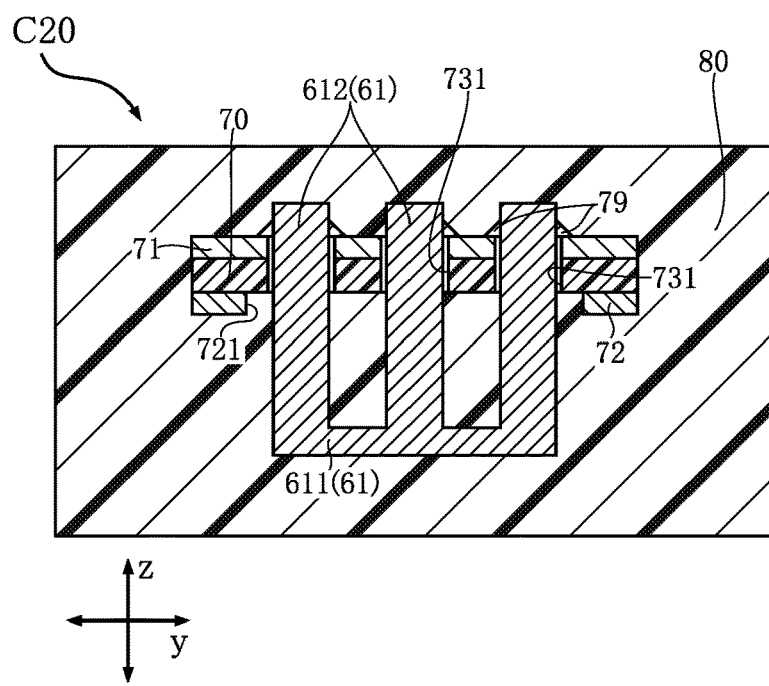
FIG. 24 is a cross-sectional view taken along a line XXIV-XXIV in FIG. 20.

As shown in FIGS. 21, 22, and 24, the first supply terminal 61 includes a first connection portion 611 and a first upright portion 612. The first connection portion 611 has the shape of a band extending in the first direction x. The first connection portion 611 is in contact with the insulator 69, on the side in the thickness direction z that the back surface 102 of the insulating substrate 10 faces. The first upright portion 612 extends from a leading end of the first connection portion 611 on the one side in the first direction x toward the side in the thickness direction z that the main surface 101 of the insulating substrate 10 faces. In the bus bar C20, which is an example, the first upright portion 612 includes three regions that are spaced apart from each other in the second direction y. Accordingly, the first upright portion 612 has the shape of comb teeth. It should be noted that the number of regions is not limited to that in this configuration.

Figure 20:
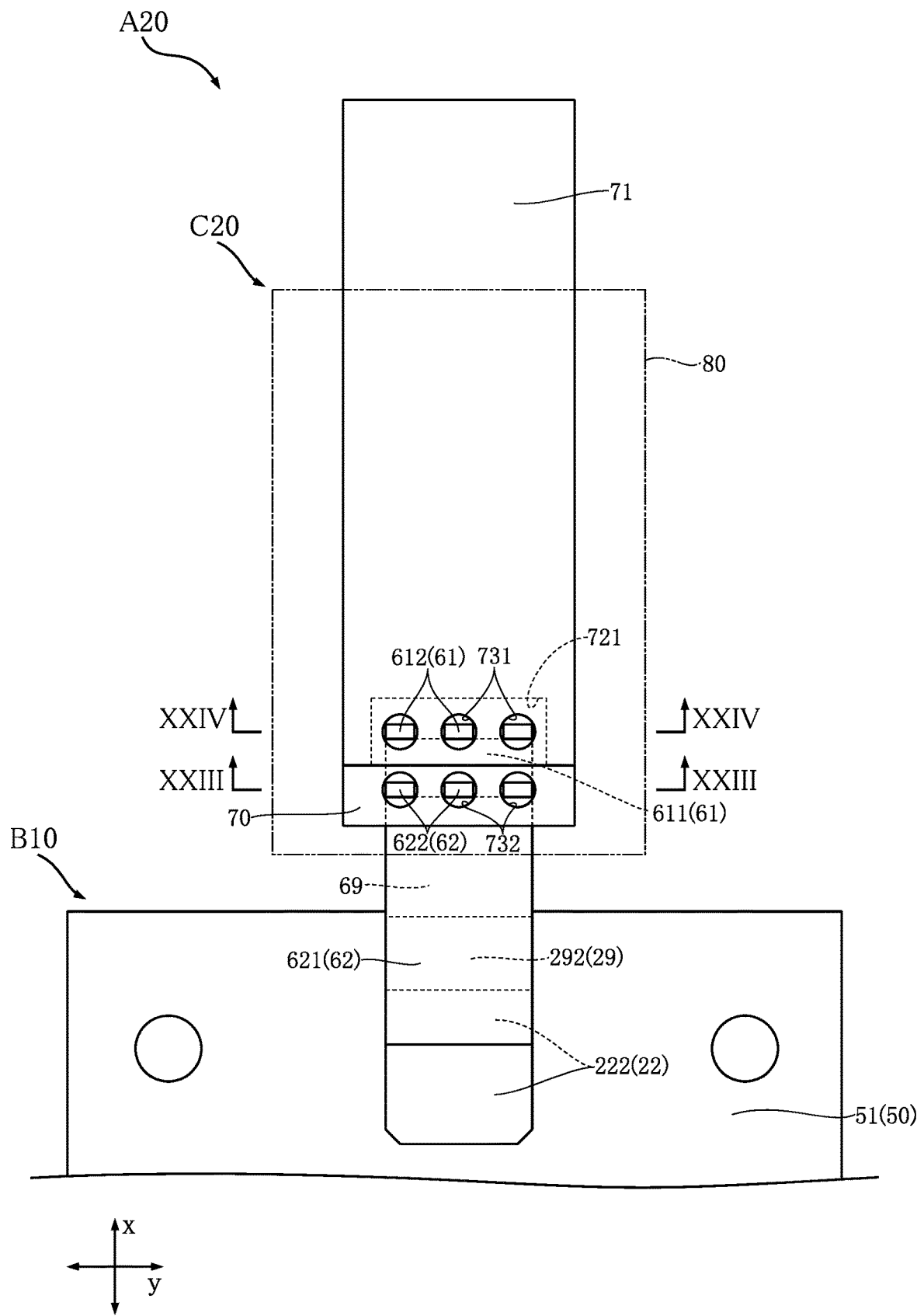
FIG. 20 is a partial enlarged view of FIG. 19, with a molding resin portion being transparent.
Figure 23:
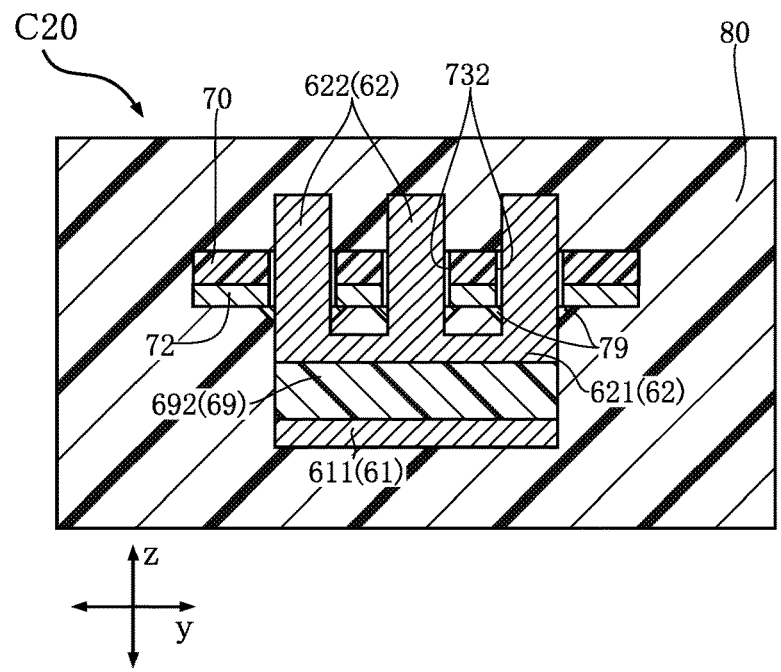
FIG. 23 is a cross-sectional view taken along a line XXIII-XXIII in FIG. 20.

As shown in FIGS. 20, 22, and 23, the second supply terminal 62 includes a second connection portion 621 and a second upright portion 622. The second connection portion 621 is in contact with the insulator 69, on the side in the thickness direction z that the main surface 101 of the insulating substrate 10 faces. The second connection portion 621 overlaps with the first connection portion 611 as viewed in the thickness direction z. The second upright portion 622 extends from a leading end of the second connection portion 621 on the one side in the first direction x toward the side in the thickness direction z that the main surface 101 faces. In the bus bar C20, which is an example, the second upright portion 622 includes three regions that are spaced apart from each other in the second direction y. Accordingly, the second upright portion 622 has the shape of comb teeth. It should be noted that the number of regions is not limited to that in this configuration. The second upright portion 622 is located further toward the other side in the first direction x than the first upright portion 612, and overlaps with the first upright portion 612 as viewed in the first direction x. The molding resin portion 80 is interposed between the second upright portion 622 and the first upright portion 612 in the first direction x.

As shown in FIGS. 22 and 23, the insulator 69 is sandwiched between the first connection portion 611 of the first supply terminal 61 and the second connection portion 621 of the second supply terminal 62 in the thickness direction z. The insulator 69 is located further toward the one side in the first direction x than respective leading ends of the first connection portion 611 and the second connection portion 621 that are located on the other side in the first direction x. Similarly to the insulator 69 of the bus bar C10, the insulator 69 includes one pair of separated portions 691 and a base portion 692.

In the above-described configuration, at least a portion of the second supply terminal 62 overlaps with the first supply terminal 61 as viewed in the thickness direction z. The second supply terminal 62 is spaced apart from the first supply terminal 61, on the side in the thickness direction z that the main surface 101 faces. Further, the first supply terminal 61 and the second supply terminal 62 partially overlap with each other as viewed in both the thickness direction z and the first direction x, and constitute laminated wiring in a state of being electrically insulated from each other by the insulator 69 and the molding resin portion 80.

Figure 19:
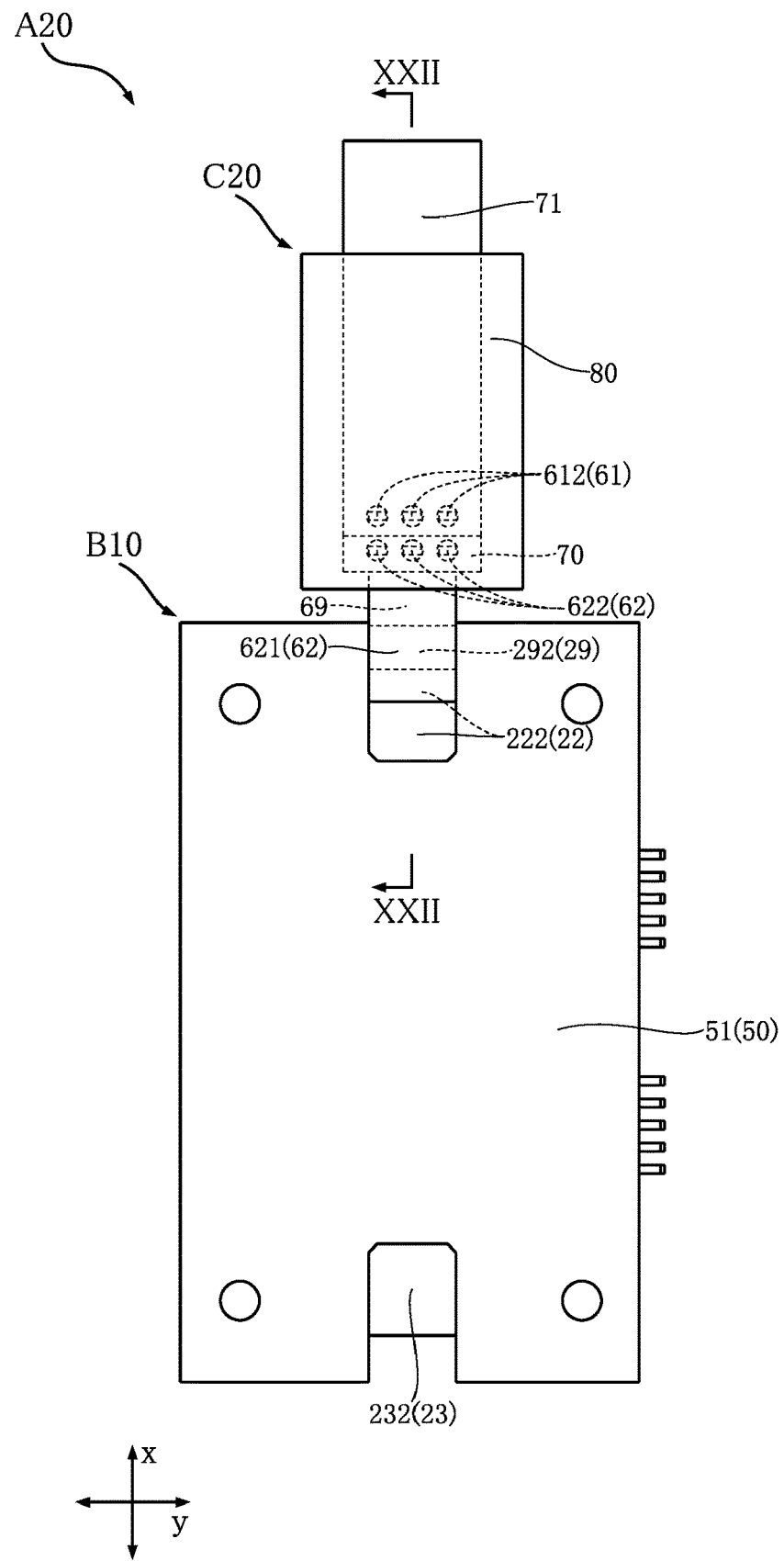
FIG. 19 is a plan view of a semiconductor module according to a second embodiment of the present disclosure.

As shown in FIGS. 19 and 22, the insulating base 70 has the shape of a band extending in the first direction x. With respect to the second connection portion 621 of the second supply terminal 62, the insulating base 70 is located on the side in the thickness direction z that the main surface 101 of the insulating substrate 10 faces. The insulating base 70 is made of a material that contains a glass epoxy resin or a ceramic such as alumina.

As shown in FIG. 22, the first conductive layer 71 is arranged on the insulating base 70, on the side in the thickness direction z that the main surface 101 of the insulating substrate 10 faces. As shown in FIG. 20, the leading end of the first conductive layer 71 on the other side in the first direction x is located further toward the one side in the first direction x than the leading end of the insulating base 70 on the other side in the first direction x. The first conductive layer 71 is a metal plate. The metal plate is made of copper or a copper alloy.

As shown in FIG. 22, the second conductive layer 72 is arranged on the insulating base 70, on the side in the thickness direction z that the back surface 102 of the insulating substrate 10 faces. The second conductive layer 72 has an opening 721 that passes therethrough in the thickness direction z. As shown in FIG. 21, the opening 721 has a rectangular shape as viewed in the thickness direction z. In the above-described configuration, the first conductive layer 71 and the second conductive layer 72 partially overlap with each other as viewed in the thickness direction z, and constitute laminated wiring in a state of being electrically insulated from each other by the insulating base 70.

As shown in FIGS. 20 to 24 (excluding FIG. 23), a plurality of first through-holes 731 are provided in both the insulating base 70 and the first conductive layer 71, passing therethrough in the thickness direction z. The number of first through-holes 731 corresponds to the number of regions of the first upright portion 612 of the first supply terminal 61. The first through-holes 731 are arranged in the second direction y. As shown in FIG. 21, the first through-holes 731 are located inside the opening 721 of the second conductive layer 72. The first upright portion 612 is inserted into each of the first through-holes 731. As shown in FIG. 24, the first upright portion 612 is joined to the first conductive layer 71 in a state of being electrically connected thereto by a conductive joining layer 79. The conductive joining layer 79 is made of lead-free solder that contains tin as the main component, for example. Thus, the first supply terminal 61 is electrically connected to the first conductive layer 71.

As shown in FIGS. 20, 22, and 23, a plurality of second through-holes 732 are provided in both the insulating base 70 and the second conductive layer 72, passing therethrough in the thickness direction z. The number of second through-holes 732 corresponds to the number of regions of the second upright portion 622 of the second supply terminal 62. The second through-holes 732 are located further toward the other side in the first direction x than the first through-holes 731. The second through-holes 732 are arranged in the second direction y. The second upright portion 622 is inserted into each of the second through-holes 732. As shown in FIG. 23, the second upright portion 622 is joined to the second conductive layer 72 in a state of being electrically connected thereto by a conductive joining layer 79. Thus, the second supply terminal 62 is electrically connected to the second conductive layer 72.

As shown in FIGS. 19 and 22, the molding resin portion 80 covers respective portions of the first supply terminal 61, the second supply terminal 62, the insulator 69, the insulating base 70, the first conductive layer 71, and the second conductive layer 72. Respective portions of the insulating base 70, the first conductive layer 71, and the second conductive layer 72 protrude from the one side of the molding resin portion 80 in the first direction x. Respective portions of the first connection portion 611 of the first supply terminal 61, the second connection portion 621 of the second supply terminal 62, and the insulator 69 protrude from the other side of the molding resin portion 80 in the first direction x.

<Semiconductor Module A20>

The following describes the semiconductor module A20.

As shown in FIG. 22, in the semiconductor module A20, the first connection portion 611 of the first supply terminal 61 is joined to the first terminal portion 212 of the first input terminal 21 in a state of being electrically connected thereto, and the second connection portion 621 of the second supply terminal 62 is joined to the second terminal portion 222 of the second input terminal 22 in a state of being electrically connected thereto. A portion of the first connection portion 611 on the other side in the first direction x is overlaid by the first terminal portion 212. A portion of the second connection portion 621 on the other side in the first direction x is overlaid on the second terminal portion 222. In this case, the extension portion 292 of the insulating member 29 is inserted into the space between the pair of separated portions 691 of the insulator 69 in the thickness direction z. The first connection portion 611 and the second connection portion 621 are respectively joined to the first terminal portion 212 and the second terminal portion 222 through laser welding in a state of being electrically connected thereto.

In the semiconductor module A20, the first supply terminal 61 and the first conductive layer 71 serve as a positive electrode and the second supply terminal 62 and the second conductive layer 72 serve as a negative electrode. As a result of portions of the first conductive layer 71 and the second conductive layer 72 on the one side in the first direction x being connected to a direct current power source DC as shown in FIGS. 25 and 26, direct current power is supplied via the bus bar C20 to the semiconductor device B10.

First Variation of Second Embodiment

Figure 25:
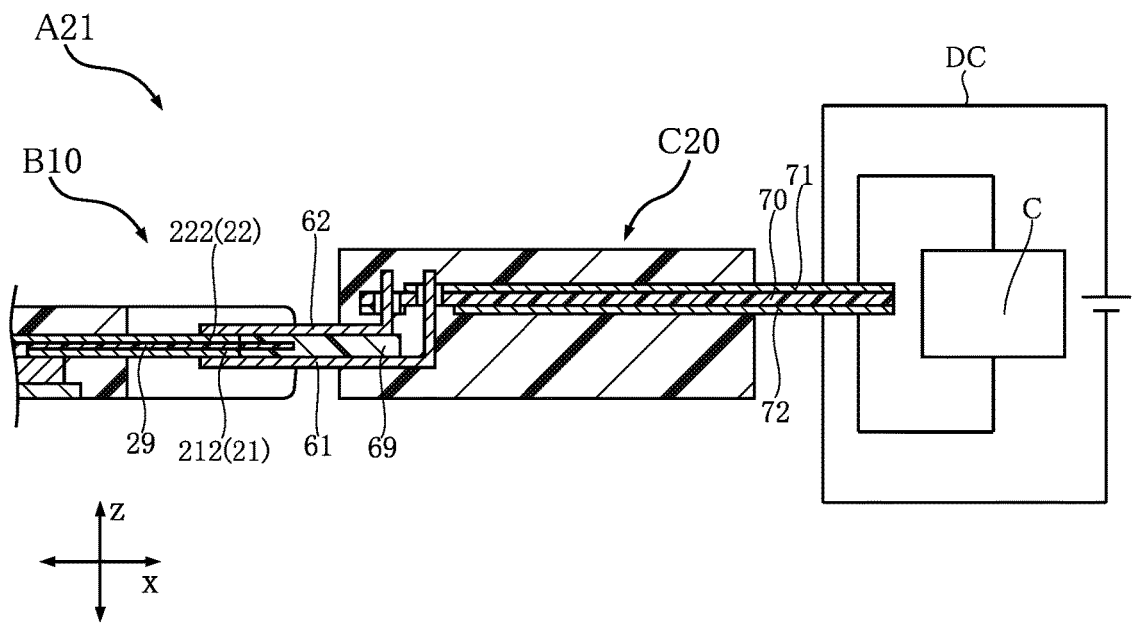
FIG. 25 is a cross-sectional view of a semiconductor module according to a first variation of the second embodiment of the present disclosure.
Figure 26:
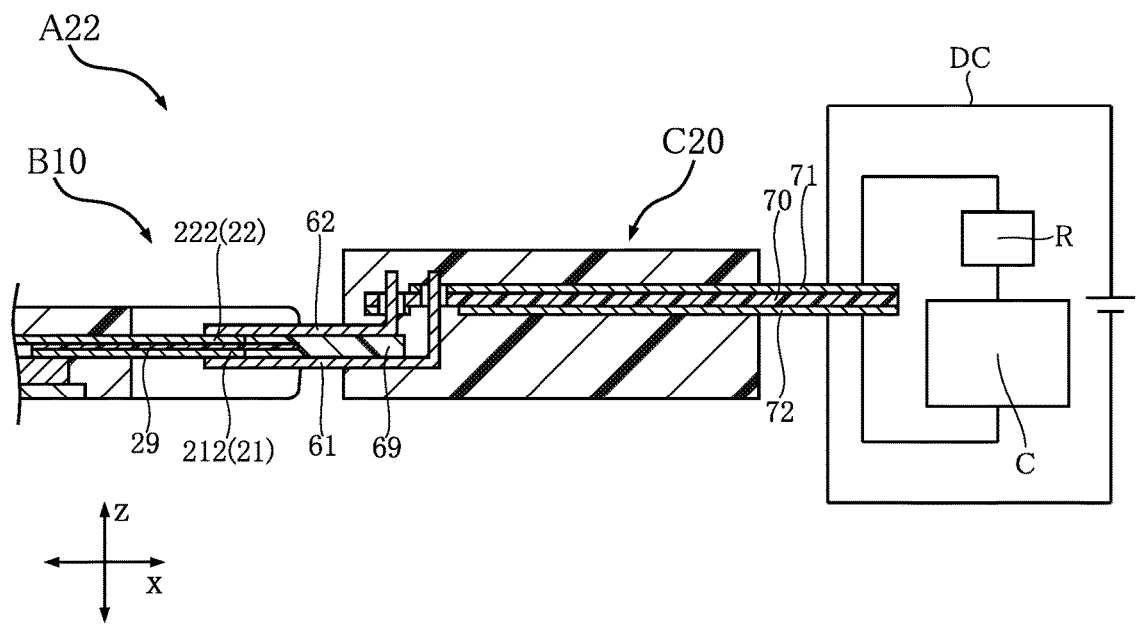
FIG. 26 is a cross-sectional view of a semiconductor module according to a second variation of the second embodiment of the present disclosure.

The following describes a semiconductor module A21 according to a first variation of the second embodiment of the present disclosure based on FIG. 25. The semiconductor module A21 further includes a capacitor C, compared to the semiconductor module A20.

As shown in FIG. 25, portions of the first conductive layer 71 and the second conductive layer 72 on the one side in the first direction x are connected to the direct current power source DC for supplying direct current power to the semiconductor device B10. The capacitor C is connected in parallel to the first conductive layer 71 and the second conductive layer 72 that are connected to the direct current power source DC.

Second Variation of Second Embodiment

The following describes a semiconductor module A22 according to a second variation of the second embodiment of the present disclosure based on FIG. 26. The semiconductor module A22 further includes a resistor R, compared to the semiconductor module A21.

As shown in FIG. 26, portions of the first conductive layer 71 and the second conductive layer 72 on the one side in the first direction x are connected to the direct current power source DC for supplying direct current power to the semiconductor device B10. The capacitor C is connected in parallel to the first conductive layer 71 and the second conductive layer 72 that are connected to the direct current power source DC. The resistor R is connected to the capacitor C in series. On the conduction path between the first conductive layer 71, the second conductive layer 72, and the capacitor C, the resistor R is connected between the first conductive layer 71 and the capacitor C. Thus, a snubber circuit is formed in the semiconductor module A22.

Next, functions and effects of the semiconductor module A20 will be described.

The semiconductor module A20 includes, as constituent elements, the semiconductor device B10 and the bus bar C20 that includes the first supply terminal 61 having the first connection portion 611 and the second supply terminal 62 having the second connection portion 621. The second supply terminal 62 is spaced apart from the first supply terminal 61 in the thickness direction z, and at least a portion (second connection portion 621) of the second supply terminal 62 overlaps with the first supply terminal 61 as viewed in the thickness direction z. The first connection portion 611 is joined to the first terminal portion 212 in a state of being electrically connected thereto, and the second connection portion 621 is joined to the second terminal portion 222 in a state of being electrically connected thereto. Therefore, inductance of the semiconductor device B10 can be more stably reduced in the semiconductor module A20 as well.

The bus bar C20 further includes the insulating base 70, the first conductive layer 71, and the second conductive layer 72. The first conductive layer 71 is arranged on the insulating base 70, on the side in the thickness direction z that the main surface 101 of the insulating substrate 10 faces. The second conductive layer 72 is arranged on the insulating base 70, on the side in the thickness direction z that the back surface 102 of the insulating substrate 10 faces. The first supply terminal 61 is electrically connected to the first conductive layer 71. The second supply terminal 62 is electrically connected to the second conductive layer 72. With this configuration, the first conductive layer 71 serves as the positive electrode and the second conductive layer 72 serves as the negative electrode in the semiconductor module A20. Therefore, when the back surface 102 of the semiconductor device B10 is joined to a heat sink, earth of the direct current power source DC (see FIGS. 25 and 26) that is connected to the first conductive layer 71 and the second conductive layer 72 can be more easily set on the heat sink.

The first supply terminal 61 includes the first upright portion 612 that extends from the leading end of the first connection portion 611 on the one side in the first direction x toward the side in the thickness direction z that the main surface 101 of the insulating substrate 10 faces. The first upright portion 612 is joined to the first conductive layer 71 in a state of being electrically connected thereto. The second supply terminal 62 includes the second upright portion 622 that extends from the leading end of the second connection portion 621 on the one side in the first direction x toward the side in the thickness direction z that the main surface 101 faces. The second upright portion 622 is joined to the second conductive layer 72 in a state of being electrically connected thereto. The second upright portion 622 overlaps with the first upright portion 612 as viewed in the first direction x. Thus, continuous laminated wiring can be realized in the bus bar C20 by the first supply terminal 61, the first conductive layer 71, the second supply terminal 62, and the second conductive layer 72.

The insulating base 70 and the first conductive layer are provided with the first through-holes 731 passing therethrough in the thickness direction z. As a result of the first upright portion 612 being inserted into the first through-holes 731, the first upright portion 612 can be joined to the first conductive layer 71 in a state of being electrically connected thereto. The insulating base 70 and the second conductive layer 72 are provided with the second through-holes 732 passing therethrough in the thickness direction z. As a result of the second upright portion 622 being inserted into the second through-holes 732, the second upright portion 622 can be joined to the second conductive layer 72 in a state of being electrically connected thereto. Further, the second through-holes 732 are located further toward the other side in the first direction x than the first through-holes 731. Therefore, interference between the first upright portion 612 and the second upright portion 622 can be avoided.

Third Embodiment

The following describes a semiconductor module A30 according to a third embodiment of the present disclosure based on FIGS. 27 to 33. In these figures, elements that are the same as or similar to those of the above-described semiconductor module A10 are denoted with the same reference signs as those used in the semiconductor module A10, and a redundant description will be omitted. The semiconductor module A30 includes a semiconductor device B20 and a bus bar C30.

<Semiconductor Device B20>

The following describes the semiconductor device B20 included in constituent elements of the semiconductor module A30. In the semiconductor device B20, the configurations of the first input terminal 21 and the second input terminal 22 differ from those in the semiconductor device B10 constituting the above-described semiconductor module A10.

Figure 27:
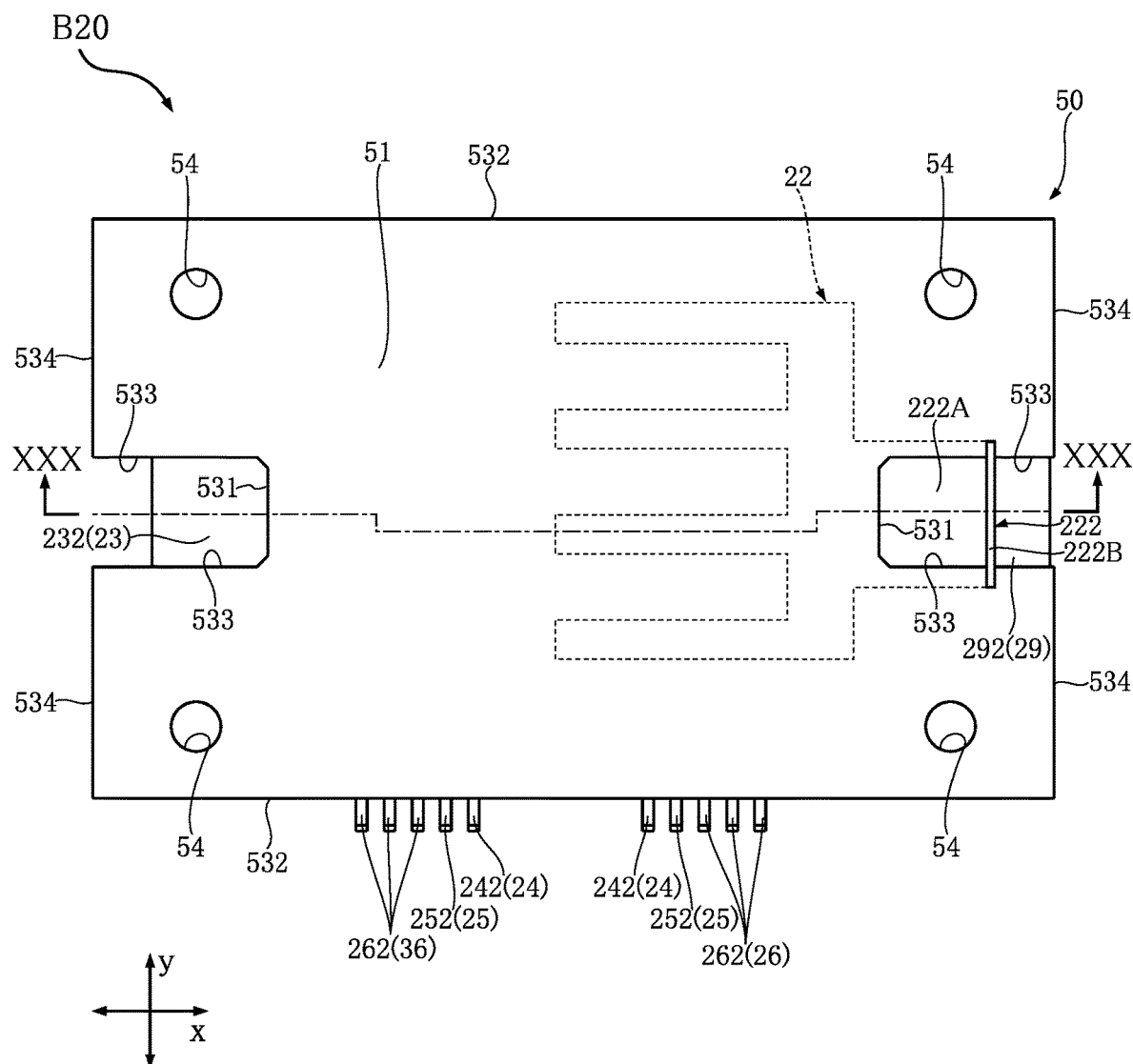
FIG. 27 is a plan view of a semiconductor device that is included in constituent elements of a semiconductor module according to a third embodiment of the present disclosure.
Figure 29:
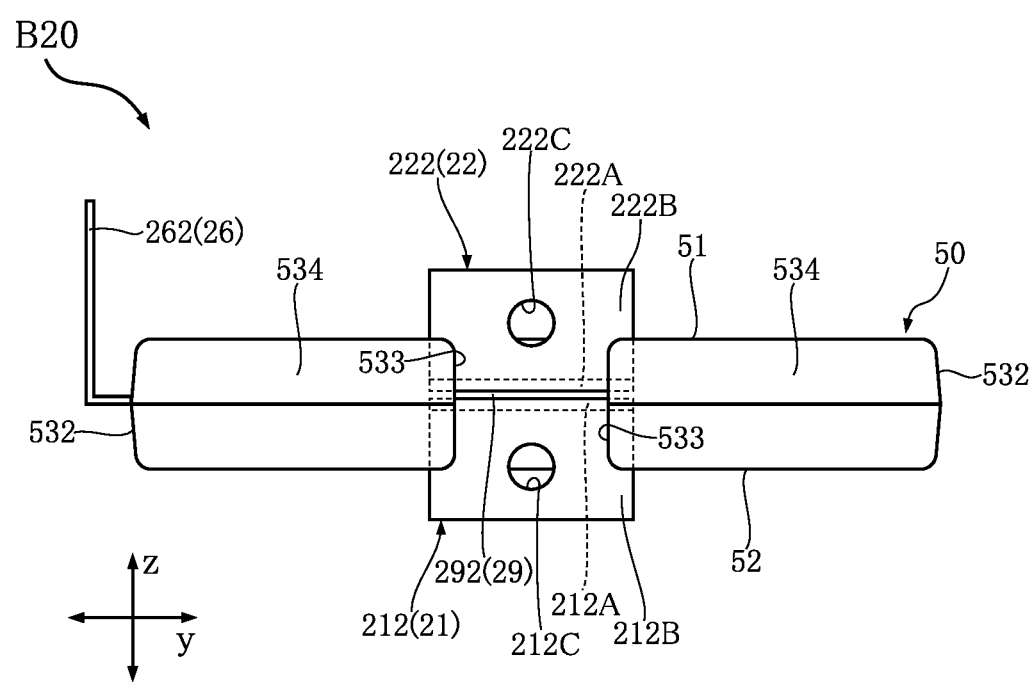
FIG. 29 is a right side view of the semiconductor device shown in FIG. 27.
Figure 30:
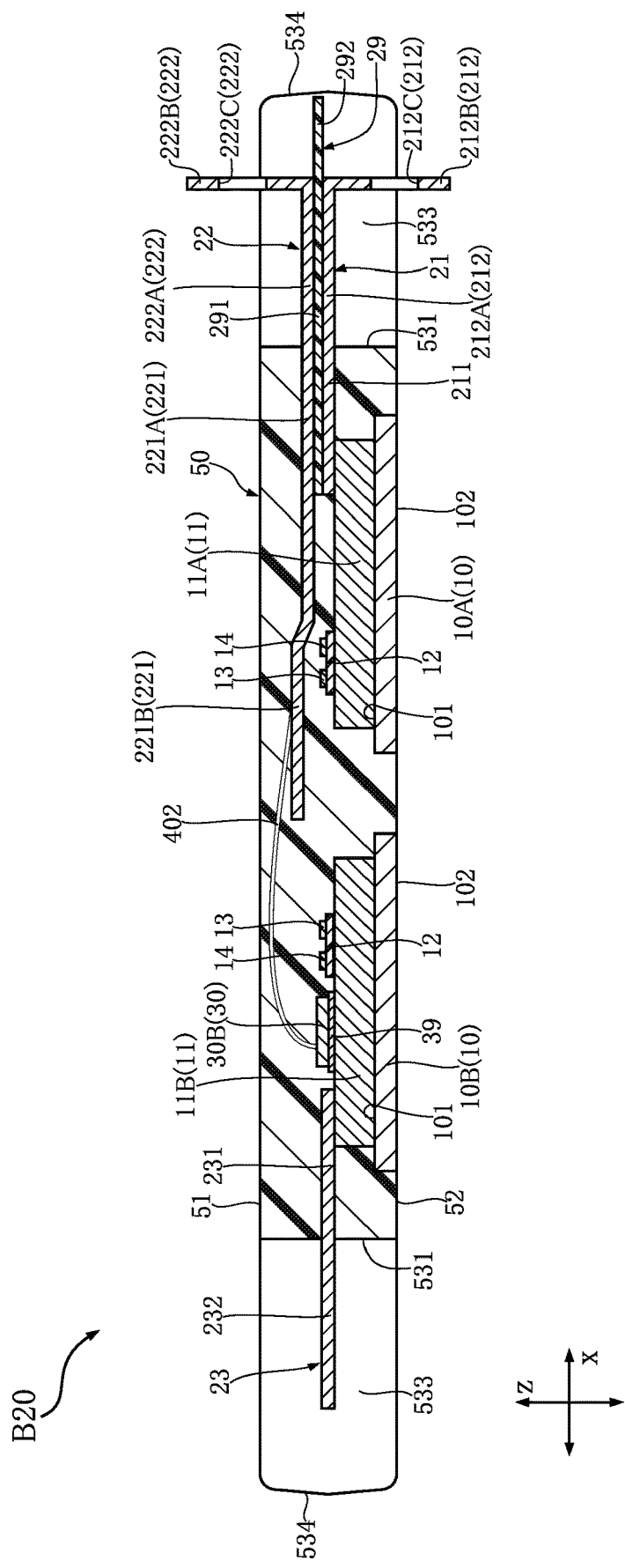
FIG. 30 is a cross-sectional view taken along a line XXX-XXX in FIG. 27.

As shown in FIGS. 27, 29 and 30, the first terminal portion 212 of the first input terminal 21 includes a first base portion 212A and a first flange portion 212B. The first base portion 212A extends in the first direction x. Portions of the first base portion 212A on both sides in the second direction y are covered by the sealing resin 50. The first flange portion 212B extends from a leading end of the first base portion 212A on the one side in the first direction x toward the side in the thickness direction z that the back surface 102 of the insulating substrate 10 faces. The first flange portion 212B is provided with a first hole 212C that passes therethrough in the first direction x.

Figure 28:
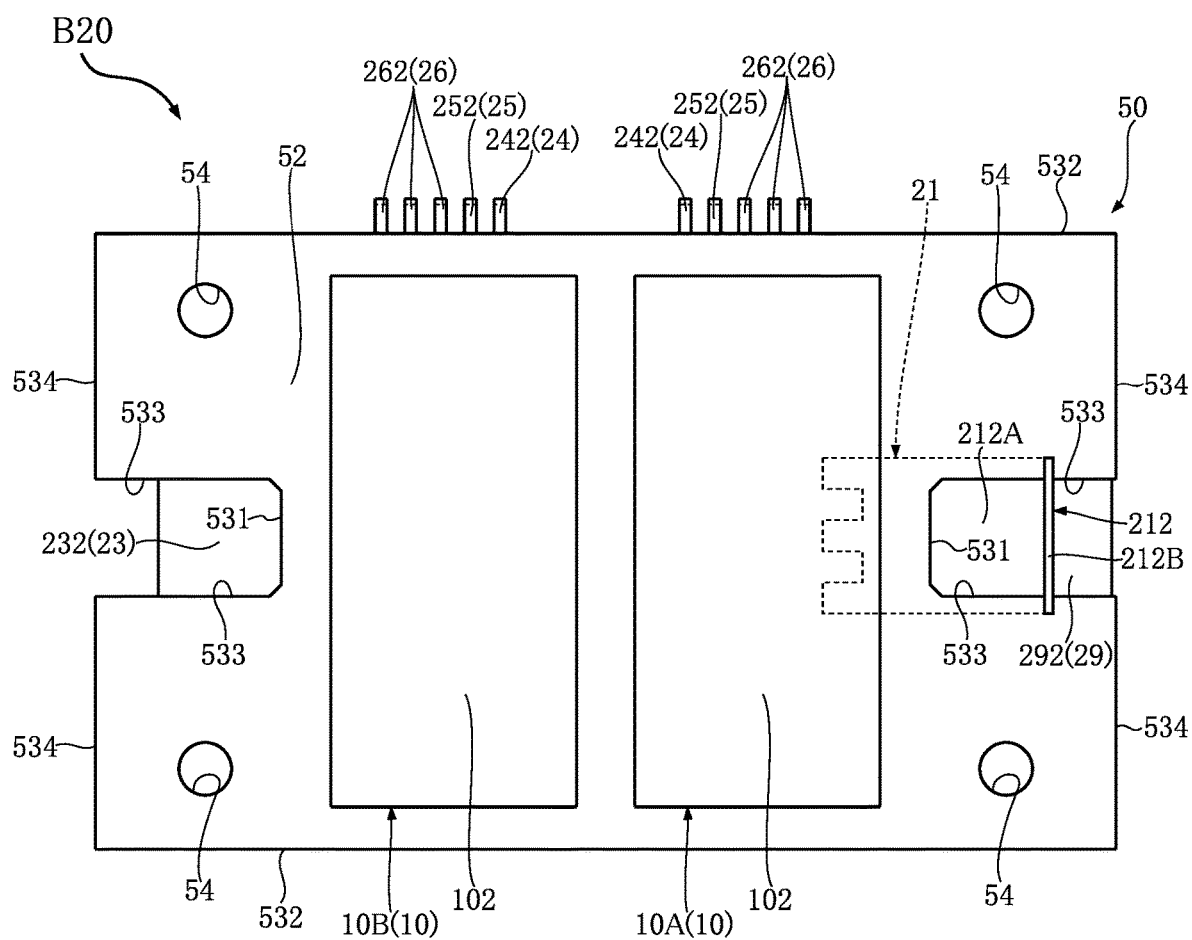
FIG. 28 is a bottom view of the semiconductor device shown in FIG. 27.
Figure 28:
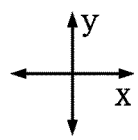

As shown in FIGS. 28 to 30, the second terminal portion 222 of the second input terminal 22 includes a second base portion 222A and a second flange portion 222B. The second base portion 222A extends in the first direction x. Portions of the second base portion 222A on both sides in the second direction y are covered by the sealing resin 50. The second flange portion 222B extends from a leading end of the second base portion 222A on the one side in the first direction x toward the side in the thickness direction z that the main surface 101 of the insulating substrate 10 faces. The second flange portion 222B is provided with a second hole 222C that passes therethrough in the first direction x.

As shown in FIG. 30, the interposed portion 291 of the insulating member 29 is located between the first base portion 212A of the first terminal portion 212 and the second base portion 222A of the second terminal portion 222 in the thickness direction z. The second input terminal 22 is spaced apart from the first input terminal 21, on the side in the thickness direction z that the main surface 101 of the insulating substrate 10 faces.

<Bus Bar C30>

The following describes the bus bar C30 included in constituent elements of the semiconductor module A30. In the bus bar C30, the configurations of the first supply terminal 61, the second supply terminal 62, and the insulator 69 differ from those in the bus bar C10 constituting the above-described semiconductor module A10.

Figure 32:
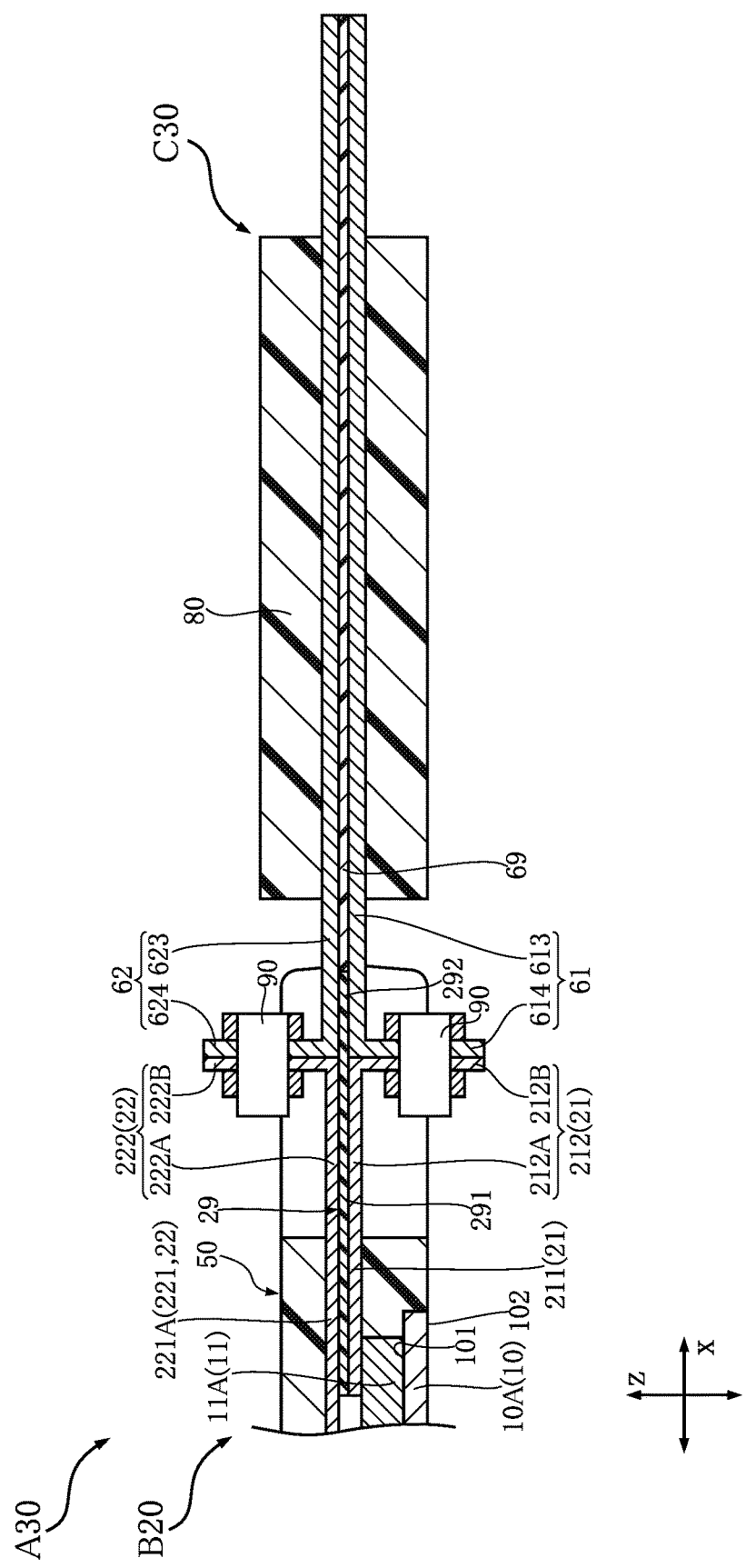
FIG. 32 is a cross-sectional view taken along a line XXXII-XXXII in FIG. 31.
Figure 33:
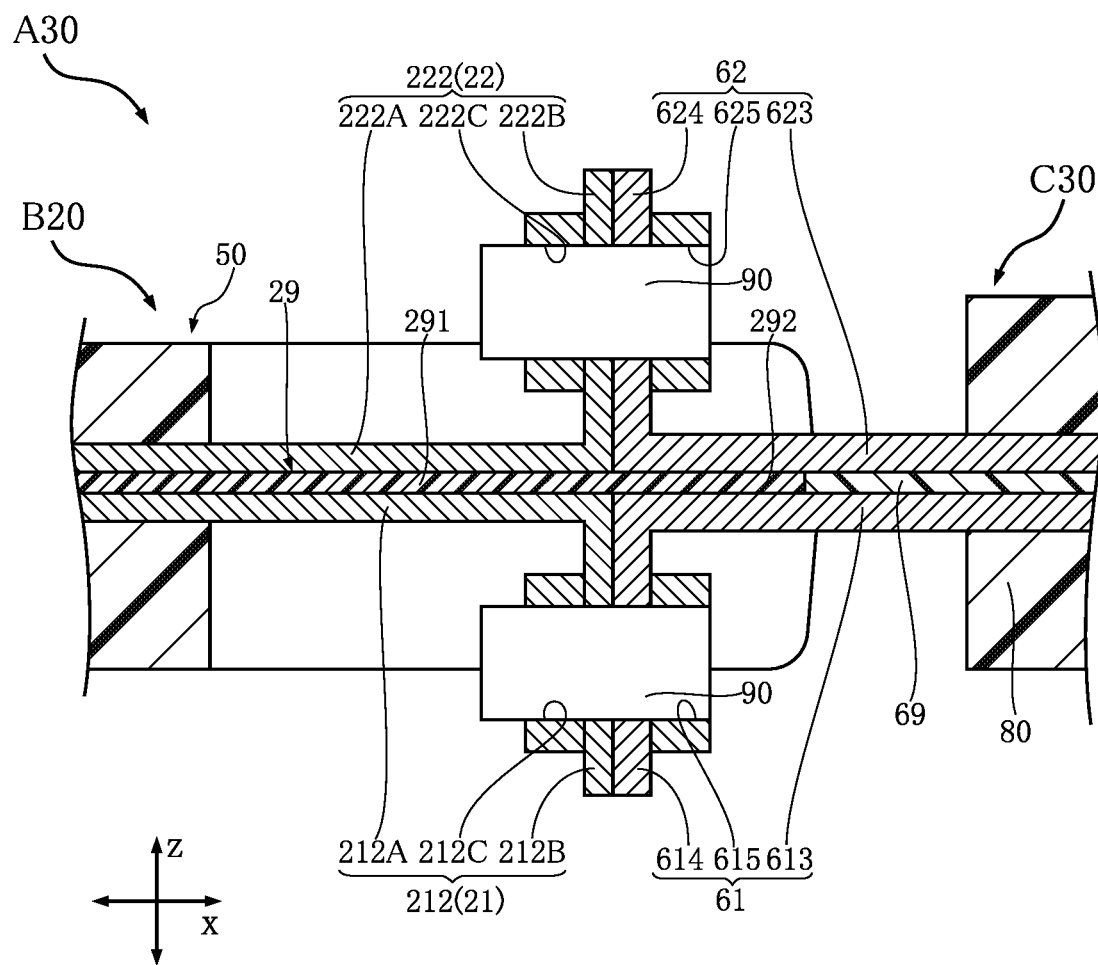
FIG. 33 is a partial enlarged view of FIG. 32.

As shown in FIG. 32, the first supply terminal 61 includes a third base portion 613 and a third flange portion 614. The third base portion 613 extends in the first direction x. The third base portion 613 is in contact with the insulator 69, on the side in the thickness direction z that the back surface 102 of the insulating substrate 10 faces. The third flange portion 614 extends from a leading end of the third base portion 613 on the other side in the first direction x toward the side in the thickness direction z that the back surface 102 faces. As shown in FIG. 33, the third flange portion 614 is provided with a third hole 615 that passes therethrough in the first direction x. The position and size of the third hole 615 correspond to those of the first hole 212C provided in the first flange portion 212B of the first terminal portion 212.

Figure 31:
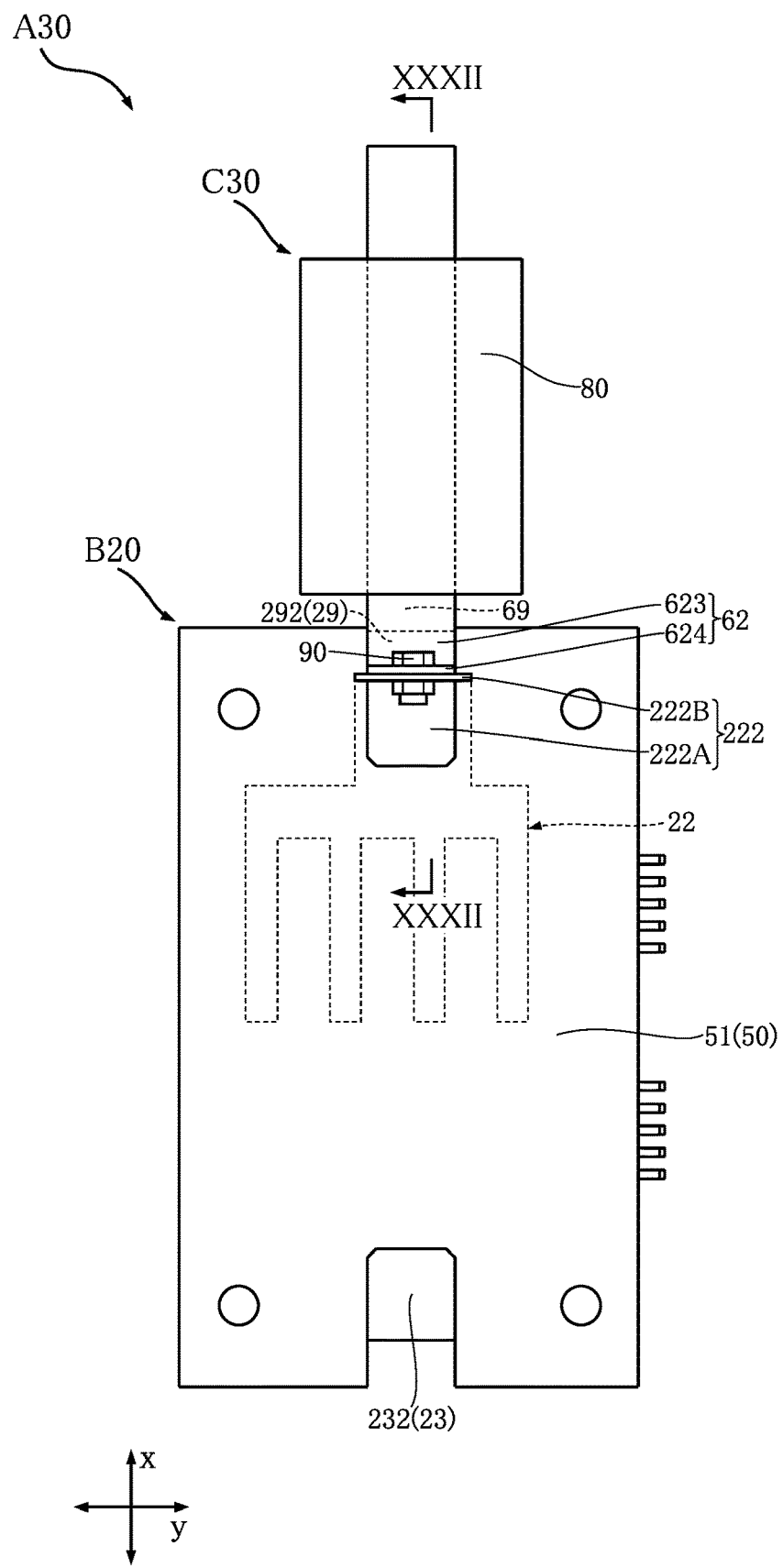
FIG. 31 is a plan view of the semiconductor module according to the third embodiment of the present disclosure.

As shown in FIGS. 31 and 32, the second supply terminal 62 includes a fourth base portion 623 and a fourth flange portion 624. The fourth base portion 623 extends in the first direction x. The fourth base portion 623 is in contact with the insulator 69, on the side in the thickness direction z that the main surface 101 of the insulating substrate 10 faces. The fourth flange portion 624 extends from a leading end of the fourth base portion 623 on the other side in the first direction x toward the side in the thickness direction z that the main surface 101 faces. As shown in FIG. 33, the fourth flange portion 624 is provided with a fourth hole 625 that passes therethrough in the first direction x. The position and size of the fourth hole 625 correspond to those of the second hole 222C provided in the second flange portion 222B of the second terminal portion 222.

As shown in FIG. 32, the second supply terminal 62 is spaced apart from the first supply terminal 61, on the side in the thickness direction z that the main surface 101 of the insulating substrate 10 faces. The third base portion 613 of the first supply terminal 61 and the fourth base portion 623 of the second supply terminal 62 overlap with each other as viewed in the thickness direction z, and constitute laminated wiring in a state of being electrically insulated from each other by the insulator 69. It should be noted that the bus bar C30 may also have a configuration that does not include the molding resin portion 80.

<Semiconductor Module A30>

The following describes the semiconductor module A30.

As shown in FIG. 32, in the semiconductor module A30, the third flange portion 614 of the first supply terminal 61 is joined to the first flange portion 212B of the first terminal portion 212 (first input terminal 21) in a state of being electrically connected thereto. The third flange portion 614 abuts against the first flange portion 212B. As shown in FIGS. 31 and 32, the fourth flange portion 624 of the second supply terminal 62 is joined to the second flange portion 222B of the second terminal portion 222 (second input terminal 22) in a state of being electrically connected thereto. The fourth flange portion 624 abuts against the second flange portion 222B. In this case, as shown in FIG. 33, the extension portion 292 of the insulating member 29 is inserted into a space between the third base portion 613 of the first supply terminal 61 and the fourth base portion 623 of the second supply terminal 62 in the thickness direction z.

As shown in FIG. 33, a fastening member 90 is inserted into the first hole 212C provided in the first flange portion 212B of the first terminal portion 212 and the third hole 615 provided in the third flange portion 614 of the first supply terminal 61. The fastening member 90 is constituted by a bolt and a nut, for example. Thus, the first flange portion 212B and the third flange portion 614 are joined together in a state of being electrically connected to each other. Also, a fastening member 90 is inserted into the second hole 222C provided in the second flange portion 222B of the second terminal portion 222 and the fourth hole 625 provided in the fourth flange portion 624 of the second supply terminal 62. Thus, the second flange portion 222B and the fourth flange portion 624 are joined together in a state of being electrically connected to each other.

In the semiconductor module A30, the first supply terminal 61 serves as a positive electrode and the second supply terminal 62 serves as a negative electrode. Therefore, as in the case of the semiconductor module A10, as a result of portions of the first supply terminal 61 and the second supply terminal 62 on the one side in the first direction x being connected to a direct current power source DC (see FIGS. 17 and 18), direct current power is supplied via the bus bar C30 to the semiconductor device B20.

The semiconductor module A30 can have a configuration that further includes a capacitor C that is connected in parallel to the first supply terminal 61 and the second supply terminal 62, similarly to the semiconductor module A11 shown in FIG. 17. Also, the semiconductor module A30 can have a configuration that further includes the capacitor C and a resistor R that is connected to the capacitor C in series, similarly to the semiconductor module A12 shown in FIG. 18.

Next, functions and effects of the semiconductor module A30 will be described.

The semiconductor module A30 includes, as constituent elements, the semiconductor device B20 that includes the first input terminal 21 having the first terminal portion 212 and the second input terminal 22 having the second terminal portion 222, and the bus bar C30 that includes the first supply terminal 61 and the second supply terminal 62. The second terminal portion 222 is spaced apart from the first terminal portion 212 in the thickness direction z and overlaps with the first terminal portion 212 as viewed in the thickness direction z. The second supply terminal 62 is spaced apart from the first supply terminal 61 in the thickness direction z and overlaps with the first supply terminal 61 as viewed in the thickness direction z. The first supply terminal 61 is joined to the first terminal portion 212 in a state of being electrically connected thereto, and the second supply terminal 62 is joined to the second terminal portion 222 in a state of being electrically connected thereto. Therefore, inductance of the semiconductor device B20 can be more stably reduced in the semiconductor module A30 as well.

The first terminal portion 212 includes the first flange portion 212B that extends from the leading end of the first base portion 212A on the one side in the first direction x toward the side in the thickness direction z that the back surface 102 of the insulating substrate 10 faces. The second terminal portion 222 includes the second flange portion 222B that extends from the leading end of the second base portion 222A on the one side in the first direction x toward the side in the thickness direction z that the main surface 101 of the insulating substrate 10 faces. The first supply terminal 61 includes the third flange portion 614 that extends from the leading end of the third base portion 613 on the other side in the first direction x toward the side in the thickness direction z that the back surface 102 faces. The second supply terminal 62 includes the fourth flange portion 624 that extends from the leading end of the fourth base portion 623 on the other side in the first direction x toward the side in the thickness direction z that the main surface 101 faces. The third flange portion 614 abuts against the first flange portion 212B. These are joined together using the fastening member 90. Thus, the first supply terminal 61 can be joined to the first terminal portion 212 in a state of being electrically connected thereto. The fourth flange portion 624 abuts against the second flange portion 222B. These are joined together using the fastening member 90. Thus, the second supply terminal 62 can be joined to the second terminal portion 222 in a state of being electrically connected thereto.

The present disclosure is not limited to the above-described embodiments. Various design changes can be made to specific configurations of respective portions described in the present disclosure.

Various embodiments in the present disclosure can be defined by the following appendixes.

Appendix 1.

A semiconductor module comprising: a semiconductor device that includes: an insulating substrate having a main surface and a back surface that face opposite to each other in a thickness direction; a conductive member arranged on the main surface; a plurality of switching elements electrically connected to the conductive member; a first input terminal having a first terminal portion and electrically connected to the conductive member; and a second input terminal having a second terminal portion overlapping with the first terminal portion as viewed in the thickness direction, the second input terminal being spaced apart from the first input terminal and the conductive member in the thickness direction and electrically connected to the plurality of switching elements; and a bus bar that includes a first supply terminal and a second supply terminal spaced apart from the first supply terminal in the thickness direction, the second supply terminal at least partially overlapping with the first supply terminal as viewed in the thickness direction, wherein the first supply terminal is electrically connected to the first terminal portion, and the second supply terminal is electrically connected to the second terminal portion.

Appendix 2.

The semiconductor module according to appendix 1, wherein the semiconductor device further includes an insulating member disposed between the first terminal portion and the second terminal portion in the thickness direction.

Appendix 3.

The semiconductor module according to appendix 2, wherein, as viewed in the thickness direction, the first terminal portion and the second terminal portion extend toward one side in a first direction orthogonal to the thickness direction, and the insulating member includes: an interposed portion located between the first terminal portion and the second terminal portion in the thickness direction; and an extension portion extending from the interposed portion toward the one side in the first direction beyond the first terminal portion and the second terminal portion.

Appendix 4.

The semiconductor module according to appendix 3, wherein the bus bar further includes an insulator disposed between the first supply terminal and the second supply terminal in the thickness direction, the first supply terminal and the second supply terminal have respective ends located on another side in the first direction, and the insulator is located further toward the one side in the first direction than the respective ends of the first supply terminal and the second supply terminal.

Appendix 5.

The semiconductor module according to appendix 4, wherein the insulator includes a pair of separated portions spaced apart from each other in the thickness direction, and the extension portion is inserted into a space provided between the pair of separated portions in the thickness direction.

Appendix 6.

The semiconductor module according to appendix 5, wherein the second terminal portion is spaced apart from the first terminal portion to a side in the thickness direction that the main surface faces, and the second supply terminal is spaced apart from the first supply terminal to the side in the thickness direction that the main surface faces.

Appendix 7.

The semiconductor module according to appendix 6, wherein a portion of the first supply terminal on the other side in the first direction overlaps with the first terminal portion, and a portion of the second supply terminal on the other side in the first direction overlaps with the second terminal portion.

Appendix 8.

The semiconductor module according to appendix 7, wherein the first supply terminal and the second supply terminal are respectively joined to the first terminal portion and the second terminal portion by laser welding in electrical connection thereto.

Appendix 9.

The semiconductor module according to appendix 6, wherein the bus bar further includes an insulating base, a first conductive layer arranged on the insulating base on the side in the thickness direction that the main surface faces, and a second conductive layer arranged on the insulating base on a side in the thickness direction that the back surface faces, the first supply terminal is electrically connected to the first conductive layer, and the second supply terminal is electrically connected to the second conductive layer.

Appendix 10.

The semiconductor module according to appendix 9, wherein the first supply terminal includes a first connection portion that is in contact with both the first terminal portion and the insulator, and a first upright portion that extends from a leading end of the first connection portion on the one side in the first direction toward the side in the thickness direction that the main surface faces, the insulating base and the first conductive layer are provided with a first through-hole that passes in the thickness direction, and the first upright portion is inserted into the first through-hole and is joined to the first conductive layer in electrical connection thereto.

Appendix 11.

The semiconductor module according to appendix 10, wherein the second supply terminal includes a second connection portion that is in contact with both the second terminal portion and the insulator and overlaps with the first connection portion as viewed in the thickness direction, and a second upright portion that extends from a leading end of the second connection portion on the one side in the first direction toward the side in the thickness direction that the main surface faces, and overlaps with the first upright portion as viewed in the first direction, the insulating base and the second conductive layer are provided with a second through-hole that passes in the thickness direction and is located further toward the other side in the first direction than the first through-hole, and the second upright portion is inserted into the second through-hole and is joined to the second conductive layer in electrical connection thereto.

Appendix 12.

The semiconductor module according to appendix 4, wherein the extension portion is inserted into a space that is provided between the first supply terminal and the second supply terminal in the thickness direction.

Appendix 13.

The semiconductor module according to appendix 12, wherein the second terminal portion is spaced apart from the first terminal portion on a side in the thickness direction that the main surface faces, the second supply terminal is spaced apart from the first supply terminal on the side in the thickness direction that the main surface faces, the first terminal portion includes a first base portion that extends in the first direction and a first flange portion that extends from a leading end of the first base portion on the one side in the first direction toward a side in the thickness direction that the back surface faces, the second terminal portion includes a second base portion that extends in the first direction and a second flange portion that extends from a leading end of the second base portion on the one side in the first direction toward the side in the thickness direction that the main surface faces, the first supply terminal includes a third base portion that extends in the first direction and a third flange portion that extends from a leading end of the third base portion on the other side in the first direction toward the side in the thickness direction that the back surface faces, the second supply terminal includes a fourth base portion that extends in the first direction and a fourth flange portion that extends from a leading end of the fourth base portion on the other side in the first direction toward the side in the thickness direction that the main surface faces, the third flange portion abuts against the first flange portion, and the fourth flange portion abuts against the second flange portion.

Appendix 14.

The semiconductor module according to appendix 13, wherein the first flange portion and the third flange portion are joined together by a fastening member in electrical connection to each other, and the second flange portion and the fourth flange portion are joined together by a fastening member in electrical connection to each other.

Appendix 15.

The semiconductor module according to any one of appendixes 2 to 14, further comprising a capacitor connected in parallel to the first supply terminal and the second supply terminal.

Appendix 16.

The semiconductor module according to appendix 15, further comprising a resistor connected to the capacitor in series.

Appendix 17.

The semiconductor module according to any one of appendixes 2 to 16, wherein the semiconductor device further includes a sealing resin that covers the plurality of switching elements such that the back surface is exposed, and respective portions of the first terminal portion, the second terminal portion, and the insulating member are covered by the sealing resin.

The invention claimed is:

1. A semiconductor module comprising:
   a semiconductor device that comprises:
      an insulating substrate having a main surface and a back surface that face opposite to each other in a thickness direction;
      a first conductive portion arranged on the main surface;
      a first switching element electrically connected to the first conductive portion;

a second conductive portion arranged on the main surface;

a second switching element electrically connected to the second conductive portion;

a first input terminal having a first terminal portion and electrically connected to the first conductive portion; and a second input terminal having a second terminal portion overlapping with the first terminal portion as viewed in the thickness direction, the second input terminal being spaced apart from the first input terminal and the first conductive portion in the thickness direction and electrically connected to the second switching element; and a sealing resin having an approximately rectangular shape in a plan view and sealing the first input terminal and the second input terminal so that they are partially exposed from a first side of the sealing resin, wherein the sealing resin partially covers lateral surfaces and upper surfaces of the first input terminal and the second input terminal but does not cover tips of central portions of the first input terminal and the second input terminal.

2. The semiconductor module according to claim 1, wherein the semiconductor device further comprises an insulating member disposed between the first input terminal and the second input terminal in the thickness direction.

3. The semiconductor module according to claim 2, wherein the insulating member comprises: an interposed portion located between the first terminal portion and the second terminal portion in the thickness direction; and an extension portion extending from the interposed portion toward the first side in the first direction beyond the first terminal portion and the second terminal portion.

4. The semiconductor module according to claim 2, wherein the insulating member is constituted by insulating paper.

5. The semiconductor module according to claim 2, wherein a thickness of the insulating member and the first and second conductive portions is smaller than a half of that of the sealing resin.

6. The semiconductor module according to claim 3, wherein a tip of the insulating member is longer than tips of the first input terminal and the second input terminal.

7. The semiconductor module according to claim 3, wherein a tip of the insulating member is flush with a side of the sealing resin.

8. The semiconductor module according to claim 1, further comprising an output terminal electrically connected to a connection point of the first switching element and the second switching element, wherein the output terminal is exposed from a side of the sealing resin opposite to the first side of the sealing resin from which the input terminals are exposed.

9. The semiconductor module according to claim 1, wherein the second switching element is disposed on a main surface of the second conductive portion.

10. The semiconductor module according to claim 1, wherein the back surface of the insulating substrate is exposed from the sealing resin.

11. The semiconductor module according to claim 8, wherein the tip of the output terminal recesses inward from the first side of the sealing resin.

12. The semiconductor module according to claim 1, wherein each of the first switching element and the second switching element is an SiC MOSFET or an IGBT.

13. The semiconductor module according to claim 8, wherein control terminals are exposed from a side of the sealing resin different from the sides of the sealing resin from which the input terminals and the output terminal are exposed.

14. The semiconductor module according to claim 10, wherein respective portions of the first terminal portion, the second terminal portion, and the insulating member are covered by the sealing resin portion.

15. The semiconductor module according to claim 1, wherein the first conductive portion and the first switching element are conducted to each other via a back surface of the first switching element.

16. The semiconductor module according to claim 1, wherein the second conductive portion and the second switching element are conducted to each other via a back surface of the second switching element.

17. The semiconductor module according to claim 1, wherein the second input terminal further includes a linkage portion and a plurality of comb teeth-shaped extension portions, and is electrically connected to the second switching element through the respective extension portions.

* * * * *